United States Patent
Vyas et al.

(10) Patent No.: US 9,606,706 B2
(45) Date of Patent: Mar. 28, 2017

(54) BATTERY USAGE TRACKING USER INTERFACE

(71) Applicant: Apple Inc., Cupertino, CA (US)

(72) Inventors: Amit K. Vyas, San Jose, CA (US); Patrick L. Coffman, San Francisco, CA (US); Albert S. Liu, Fremont, CA (US); Abhinav Pathak, San Jose, CA (US); Anand Ramadurai, Los Gatos, CA (US)

(73) Assignee: Apple Inc., Cupertino, CA (US)

( * ) Notice: Subject to any disclaimer, the term of this patent is extended or adjusted under 35 U.S.C. 154(b) by 93 days.

(21) Appl. No.: 14/503,078

(22) Filed: Sep. 30, 2014

(65) Prior Publication Data

US 2015/0346933 A1     Dec. 3, 2015

Related U.S. Application Data

(60) Provisional application No. 62/006,029, filed on May 30, 2014.

(51) Int. Cl.
| | | |
|---|---|---|
| *G06F 3/048* | (2013.01) | |
| *G06F 3/0484* | (2013.01) | |
| *G06F 1/28* | (2006.01) | |
| *G01R 31/36* | (2006.01) | |

(52) U.S. Cl.
CPC ....... *G06F 3/0484* (2013.01); *G01R 31/3682* (2013.01); *G06F 1/28* (2013.01)

(58) Field of Classification Search
CPC ........ G06F 1/3202; G06F 1/3231; G06F 1/26; G06F 1/206; G06F 1/3228; G06F 1/08; G06F 1/3289; G06F 1/266; H04L 12/12; H04L 12/10
See application file for complete search history.

(56) References Cited

U.S. PATENT DOCUMENTS

| | | |
|---|---|---|
| 6,323,846 B1 | 11/2001 | Westerman et al. |
| 6,570,557 B1 | 5/2003 | Westerman et al. |
| 6,677,932 B1 | 1/2004 | Westerman |
| 7,614,008 B2 | 11/2009 | Ording |
| 7,633,076 B2 | 12/2009 | Huppi et al. |
| 7,653,883 B2 | 1/2010 | Hotelling et al. |
| 7,657,849 B2 | 2/2010 | Chaudhri et al. |
| 7,663,607 B2 | 2/2010 | Hotelling et al. |
| 7,844,914 B2 | 11/2010 | Andre et al. |
| 7,957,762 B2 | 6/2011 | Herz et al. |
| 8,006,002 B2 | 8/2011 | Kalayjian et al. |

(Continued)

OTHER PUBLICATIONS

Lemay et al., U.S. Appl. No. 60/936,562, filed Jun. 20, 2007, titled "Portable Multifunction Device, Method, and Graphical User Interface for Playing Online Videos", 61 pages.

(Continued)

*Primary Examiner* — Zahid Choudhury

(74) *Attorney, Agent, or Firm* — Morrison & Foerster LLP

(57) ABSTRACT

A portable electronic device having a user interface for displaying battery usage of the device over a given time period, with the battery usage from various subsystems. The various subsystems including at least one hardware subsystem and the battery usage attributed to a plurality of software applications based on activity of the plurality of software applications, while battery usage of the various subsystems was monitored.

48 Claims, 17 Drawing Sheets

(56) References Cited

U.S. PATENT DOCUMENTS

| | | |
|---|---|---|
| 8,126,517 B2 | 2/2012 | Ashbrook et al. |
| 8,239,784 B2 | 8/2012 | Hotelling et al. |
| 8,279,180 B2 | 10/2012 | Hotelling et al. |
| 8,381,135 B2 | 2/2013 | Hotelling et al. |
| 8,479,122 B2 | 7/2013 | Hotelling et al. |
| 8,504,118 B2 | 8/2013 | Kharia et al. |
| 8,768,419 B2* | 7/2014 | Sivaraman ........ H04W 52/0261 320/136 |
| 2002/0015024 A1 | 2/2002 | Westerman et al. |
| 2005/0190059 A1 | 9/2005 | Wehrenberg |
| 2006/0017692 A1 | 1/2006 | Wehrenberg et al. |
| 2006/0026536 A1 | 2/2006 | Hotelling et al. |
| 2006/0033724 A1 | 2/2006 | Chaudhri et al. |
| 2006/0197753 A1 | 9/2006 | Hotelling |
| 2008/0320391 A1 | 12/2008 | Lemay et al. |
| 2009/0164152 A1* | 6/2009 | Creus .................. G06F 1/3203 702/63 |
| 2009/0287433 A1* | 11/2009 | Houston ................ G01R 22/10 702/62 |
| 2011/0001457 A1 | 1/2011 | Mueller et al. |
| 2011/0071780 A1 | 3/2011 | Tarkoma et al. |
| 2011/0301890 A1 | 12/2011 | Shirriff et al. |
| 2012/0015695 A1* | 1/2012 | Hackborn ........... G06F 11/3409 455/566 |
| 2012/0317432 A1* | 12/2012 | Assad .................. G06F 1/3212 713/340 |
| 2013/0332749 A1* | 12/2013 | Kida ........................ G06F 1/26 713/300 |
| 2014/0068314 A1* | 3/2014 | Kim ...................... G06F 1/3212 713/340 |
| 2014/0089842 A1* | 3/2014 | Lin ....................... G06F 3/0484 715/781 |
| 2014/0278166 A1* | 9/2014 | Takahashi .......... G01R 31/3689 702/62 |
| 2014/0330764 A1* | 11/2014 | Rhines ..................... G06N 5/02 706/46 |
| 2015/0133076 A1* | 5/2015 | Brough ................. H04W 24/10 455/405 |

OTHER PUBLICATIONS

International Search Report and Written Opinion received for PCT Patent Application No. PCT/US2014/058466, mailed on Jun. 24, 2015, 16 pages.

Invitation to Pay Additional Fees and Partial Search Report received for PCT Patent Application No. PCT/US2014/058466, mailed on Mar. 3, 2015, 6 pages.

Athukorala et al., "How Carat Affects User Behavior: Implications for Mobile Battery Awareness Applications", Proceedings of the SIGCHI Conference on Human Factors in Computing Systems, CHI '14, Apr. 26-May 1, 2014, pp. 1029-1038.

Oliner et al., "Carat: Collaborative Energy Diagnosis for Mobile Devices", SENSYS' 13, Available at <https://amplab.cs.berkeley.edu/wp-content/uploads/2013/10/oliner-Carat-SenSys13.pdf>, Nov. 11-15, 2013, 14 pages.

Office Action received for Taiwan Patent Application No. 103135094, mailed on Feb. 25, 2016, 20 pages (8 pages of English Translation and 12 pages of Official Copy).

International Preliminary Report on Patentability received for PCT Patent Application No. PCT/US2014/058466, mailed on Dec. 15, 2016, 11 pages.

Notice of Allowance received for Taiwanese Patent Application No. 103135094, mailed on Oct. 28, 2016, 2 pages (Official Copy only) (see attached 37 CFR § 1.98(a) (3)).

* cited by examiner

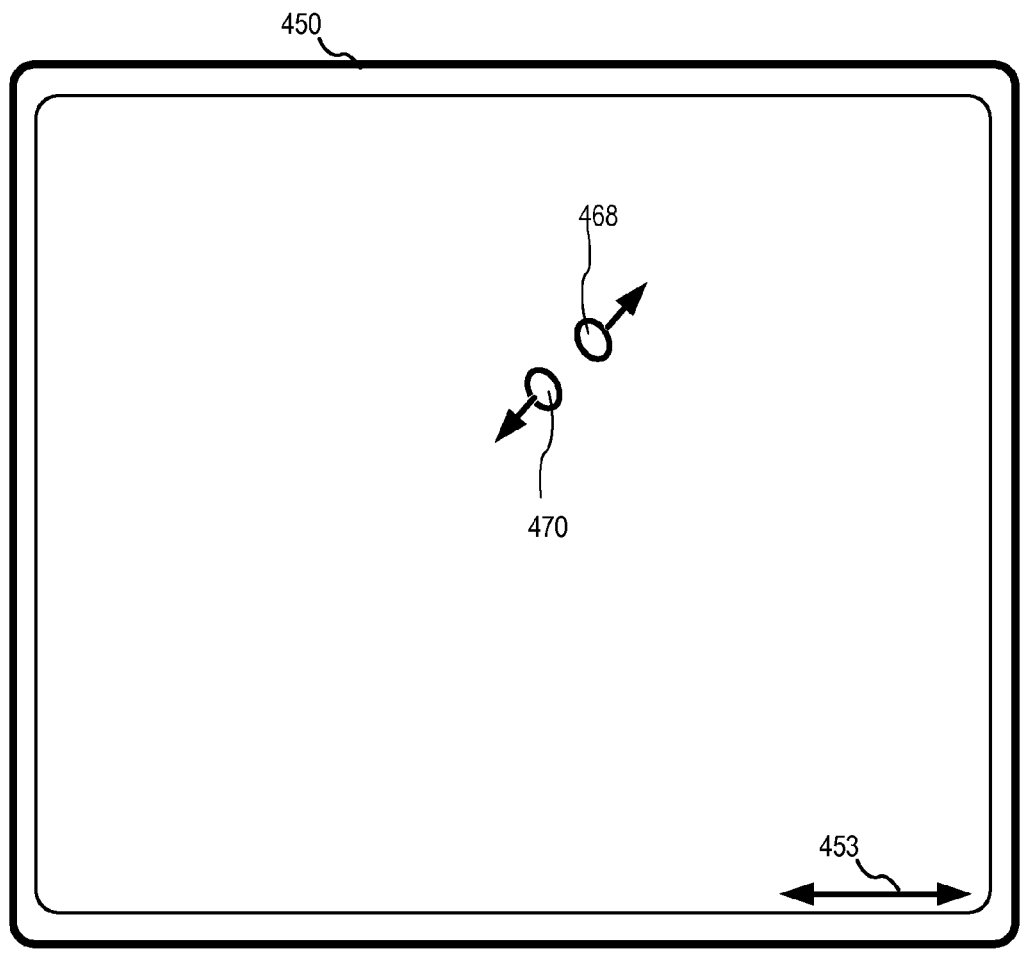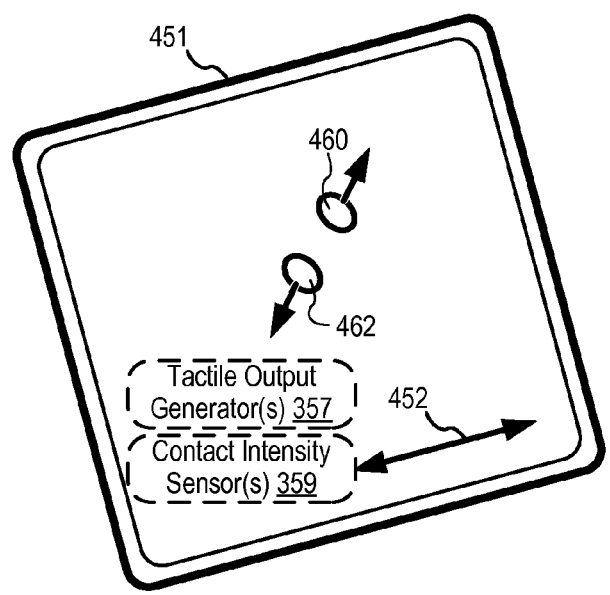
FIG. 4B

800

802
Attribute a portion of battery usage of a first hardware subsystem to a first application based on the battery usage of the first hardware subsystem that occurred during activity by the first application

804
Attribute a portion of the battery usage of the first hardware subsystem to a second application based on the battery usage of the first hardware subsystem that occurred during activity by the second application Optionally, attribute a portion of battery usage of a second hardware subsystem to the first application based on the battery usage of the second hardware subsystem that occurred during activity by the first application, and attribute a portion of the battery usage of the second hardware subsystem to the second application based on the battery usage of the second hardware subsystem that occurred during activity by the second application Optionally, attribute a portion of battery usage of a first software subsystem to the first application based on the battery usage of the first software subsystem that occurred during activity by the first application, and attribute a portion of the battery usage of the first software subsystem to the second application based on the battery usage of the first software subsystem that occurred during activity by the second application

806
Receive a request to display a battery usage user interface

808
In response to the request, display the battery usage user interface that includes a representation of the battery usage attributed to the first application and a representation of the battery usage attributed the second application

Determine battery usage attributed to a first application over a first time period. The battery usage attributed to the first application over the first time period includes exceptional battery usage that occurred during the first time period

904

Receive a request to display a battery usage user interface

906

If the exceptional battery usage attributed to the first application that occurred during the first time period meets qualifier display criteria, display a representation of battery usage attributed to the first application over the first time period that includes qualifier information that is indicative of one or more causes of the exceptional battery usage attributed to the first application over the first time period

908

If the exceptional battery usage attributed to the first application that occurred during the first time period does not meet the qualifier display criteria, display a representation of battery usage attributed to the first application over the first time period that does not include the qualifier information

FIG. 9

BATTERY USAGE TRACKING USER INTERFACE

RELATED APPLICATIONS

This application claims priority to U.S. Provisional Application Ser. No. 62/006,029, filed May 30, 2014, which is incorporated herein in its entirety.

BACKGROUND

1. Field

The present disclosure relates generally to computer user interfaces for battery-powered devices, and more specifically to a user interface for tracking battery usage by software application.

2. Description of Art

In recent years, portable electronic devices such as cellular phones, tablet computers, and laptop computers have increasingly become multifunctional devices, largely driven by their ability to support a wide range of software applications. Moreover, such devices typically rely on rechargeable batteries to power the hardware and software systems that support the operation of such applications. As these devices become more fundamentally integrated into the daily routine of users, tracking of battery usage to better understand battery-consumption and optimize device use times has become increasingly important.

BRIEF SUMMARY

While these devices may provide interfaces for monitoring overall remaining battery life and, in some cases, for monitoring additional details such as time-of-use since the battery was last charged, such limited interfaces would not provide a user with the ability to track battery usage in relation to particularly software applications—and therefore the particular functions—that are being used on the device. Such interfaces also cannot provide recommendations for further conserving battery power based on patterns of device usage, particularly from an application-based perspective.

Accordingly, there is a need for additional tracking information with respect to battery usage on their device, such as information relating battery usage more directly to the functions that the user may employ most. The devices, methods, and interfaces described herein address the issues described above and reduce the cognitive burden on a user, produce a more efficient human-machine interface, In some embodiments, a method of attributing and displaying battery usage comprises: at an electronic device with one or more processors and memory: attributing a portion of battery usage of a first hardware subsystem to a first application based on the battery usage of the first hardware subsystem that occurred during activity by the first application; attributing a portion of the battery usage of the first hardware subsystem to a second application based on the battery usage of the first hardware subsystem that occurred during activity by the second application, receiving a request to display a battery usage user interface; and in response to the request, displaying the battery usage user interface that includes a representation of the battery usage attributed to the first application and a representation of the battery usage attributed the second application.

In some embodiments, a method of determining exceptional battery usage comprises: at an electronic device with one or more processors and memory: determining battery usage attributed to a first application over a first time period, wherein the battery usage attributed to the first application over the first time period includes exceptional battery usage that occurred during the first time period; receiving a request to display a battery usage user interface; and in response to receiving the request: in accordance with a determination that the exceptional battery usage attributed to the first application that occurred during the first time period meets qualifier display criteria, displaying a representation of battery usage attributed to the first application over the first time period that includes qualifier information that is indicative of one or more causes of the exceptional battery usage attributed to the first application over the first time period; and in accordance with a determination that the exceptional battery usage attributed to the first application that occurred during the first time period does not meet the qualifier display criteria, displaying a representation of battery usage attributed to the first application over the first time period that does not include the qualifier information.

In some embodiments, a method of displaying a battery usage interface comprises: at an electronic device with one or more processors and memory: receiving a request to display a battery usage user interface; determining whether battery savings suggestion criteria have been met for a first setting; and in response to the request: in accordance with a determination that the battery savings suggestion criteria have been met for the first setting, displaying a battery usage interface that includes a suggestion for adjusting the first setting; and in accordance with a determination that the battery savings suggestion criteria have not been met for the first setting, displaying a battery usage interface that does not include the suggestion for adjusting the first setting.

DESCRIPTION OF THE FIGURES

For a better understanding of the aforementioned embodiments of the invention as well as additional embodiments thereof, reference should be made to the Description of Embodiments below, in conjunction with the following drawings in which like reference numerals refer to corresponding parts throughout the figures.

FIG. 4B illustrates an exemplary user interface for a multifunction device with a touch-sensitive surface that is separate from the display in accordance with some embodiments.

FIG. 8 is a flow diagram illustrating a method for tracking battery usage.

FIG. 9 is a flow diagram illustrating a method for tracking battery usage.

DETAILED DESCRIPTION

Figure 1A:
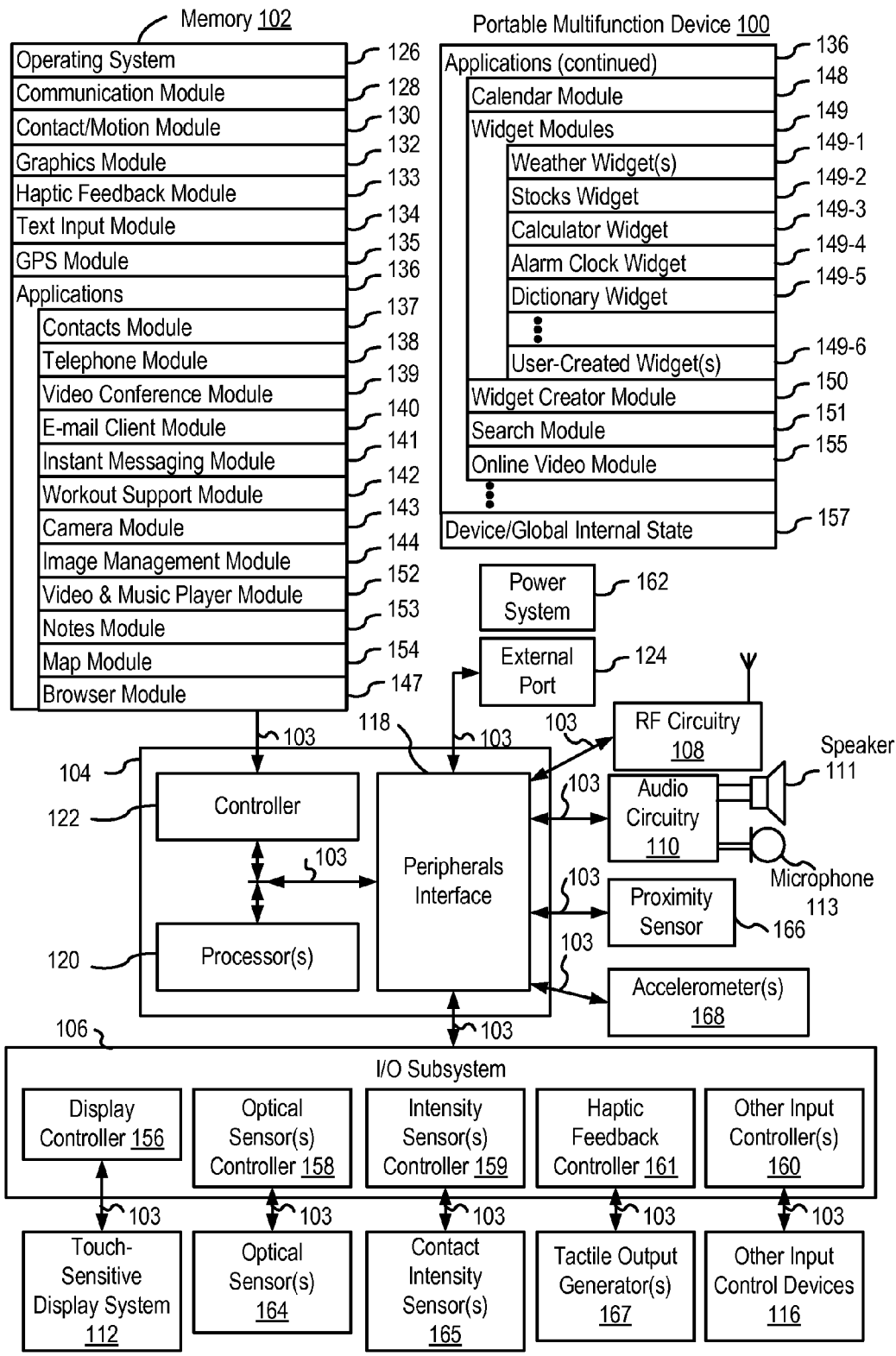
FIG. 1A is a block diagram illustrating a portable multifunction device with a touch-sensitive display in accordance with some examples.

In the following description of the disclosure and embodiments, reference is made to the accompanying drawings in which it is shown by way of illustration specific embodiments that can be practiced. It is to be understood that other embodiments and examples can be practiced and changes can be made without departing from the scope of the disclosure.

As discussed above, tracking of battery usage to better understand battery-consumption and optimize device use times has become increasingly important. It is desirable to provide an improved interface for tracking of battery usage, such as usage attributable to specific hardware and/or software subsystems, thereby allowing a user to quickly and efficiently monitor and conserve power and increase the time between battery charges.

Below, FIGS. 1A-1B, 2, 3, 4A-4B, and 5A-5B provide a description of exemplary devices for performing the techniques for tracking of battery usage. FIGS. 5A-7 illustrate exemplary user interfaces for tracking of battery usage. The user interfaces in the figures are also used to illustrate the processes described below, including the processes in FIGS. 8-10.

Although the following description uses terms "first," "second," etc. to describe various elements, these elements should not be limited by the terms. These terms are only used to distinguish one element from another. For example, a first touch could be termed a second touch, and, similarly, a second touch could be termed a first touch, without departing from the scope of the various described embodiments. The first touch and the second touch are both touches, but they are not the same touch.

The terminology used in the description of the various described embodiments herein is for the purpose of describing particular embodiments only and is not intended to be limiting. As used in the description of the various described embodiments and the appended claims, the singular forms "a", "an," and "the" are intended to include the plural forms as well, unless the context clearly indicates otherwise. It will also be understood that the term "and/or" as used herein refers to and encompasses any and all possible combinations of one or more of the associated listed items. It will be further understood that the terms "includes," "including," "comprises," and/or "comprising," when used in this specification, specify the presence of stated features, integers, steps, operations, elements, and/or components, but do not preclude the presence or addition of one or more other features, integers, steps, operations, elements, components, and/or groups thereof.

The term "if" may be construed to mean "when" or "upon" or "in response to determining" or "in response to detecting," depending on the context. Similarly, the phrase "if it is determined" or "if [a stated condition or event] is detected" may be construed to mean "upon determining" or "in response to determining" or "upon detecting [the stated condition or event]" or "in response to detecting [the stated condition or event]," depending on the context.

Embodiments of electronic devices, user interfaces for such devices, and associated processes for using such devices are described. In some embodiments, the device is a portable communications device, such as a mobile telephone, that also contains other functions, such as PDA and/or music player functions. Exemplary embodiments of portable multifunction devices include, without limitation, the iPhone®, iPod Touch®, and iPad® devices from Apple Inc. of Cupertino, Calif. Other portable electronic devices, such as laptops or tablet computers with touch-sensitive surfaces (e.g., touch screen displays and/or touchpads), are, optionally, used. It should also be understood that, in some embodiments, the device is not a portable communications device, but is a desktop computer with a touch-sensitive surface (e.g., a touch screen display and/or a touchpad).

In the discussion that follows, an electronic device that includes a display and a touch-sensitive surface is described. It should be understood, however, that the electronic device optionally includes one or more other physical user-interface devices, such as a physical keyboard, a mouse, and/or a joystick.

The device may support a variety of applications, such as one or more of the following: a drawing application, a presentation application, a word processing application, a website creation application, a disk authoring application, a spreadsheet application, a gaming application, a telephone application, a video conferencing application, an e-mail application, an instant messaging application, a workout support application, a photo management application, a digital camera application, a digital video camera application, a web browsing application, a digital music player application, and/or a digital video player application.

The various applications that are executed on the device optionally use at least one common physical user-interface device, such as the touch-sensitive surface. One or more functions of the touch-sensitive surface as well as corresponding information displayed on the device are, optionally, adjusted and/or varied from one application to the next and/or within a respective application. In this way, a common physical architecture (such as the touch-sensitive surface) of the device optionally supports the variety of applications with user interfaces that are intuitive and transparent to the user.

Attention is now directed toward embodiments of portable devices with touch-sensitive displays. FIG. 1A is a block diagram illustrating portable multifunction device 100 with touch-sensitive display system 112 in accordance with some embodiments. Touch-sensitive display 112 is sometimes called a "touch screen" for convenience and is sometimes known as or called a "touch-sensitive display system." Device 100 includes memory 102 (which optionally includes one or more computer-readable storage mediums), memory controller 122, one or more processing units (CPUs) 120, peripherals interface 118, RF circuitry 108, audio circuitry 110, speaker 111, microphone 113, input/output (I/O) subsystem 106, other input control devices 116, and external port 124. Device 100 optionally includes one or more optical sensors 164. Device 100 optionally includes one or more contact intensity sensors 165 for detecting intensity of contacts on device 100 (e.g., a touch-sensitive surface such as touch-sensitive display system 112 of device 100). Device 100 optionally includes one or more tactile output generators 167 for generating tactile outputs on device 100 (e.g., generating tactile outputs on a touch-sensitive surface such as touch-sensitive display system 112 of device 100 or touchpad 355 of device 300). These components optionally communicate over one or more communication buses or signal lines 103.

As used in the specification and claims, the term "intensity" of a contact on a touch-sensitive surface refers to the force or pressure (force per unit area) of a contact (e.g., a finger contact) on the touch-sensitive surface, or to a substitute (proxy) for the force or pressure of a contact on the touch-sensitive surface. The intensity of a contact has a range of values that includes at least four distinct values and more typically includes hundreds of distinct values (e.g., at least 256). Intensity of a contact is, optionally, determined (or measured) using various approaches and various sensors or combinations of sensors. For example, one or more force sensors underneath or adjacent to the touch-sensitive surface are, optionally, used to measure force at various points on the touch-sensitive surface. In some implementations, force measurements from multiple force sensors are combined (e.g., a weighted average) to determine an estimated force of a contact. Similarly, a pressure-sensitive tip of a stylus is, optionally, used to determine a pressure of the stylus on the touch-sensitive surface. Alternatively, the size of the contact area detected on the touch-sensitive surface and/or changes thereto, the capacitance of the touch-sensitive surface proximate to the contact and/or changes thereto, and/or the resistance of the touch-sensitive surface proximate to the contact and/or changes thereto are, optionally, used as a substitute for the force or pressure of the contact on the touch-sensitive surface. In some implementations, the substitute measurements for contact force or pressure are used directly to determine whether an intensity threshold has been exceeded (e.g., the intensity threshold is described in units corresponding to the substitute measurements). In some implementations, the substitute measurements for contact force or pressure are converted to an estimated force or pressure, and the estimated force or pressure is used to determine whether an intensity threshold has been exceeded (e.g., the intensity threshold is a pressure threshold measured in units of pressure). Using the intensity of a contact as an attribute of a user input allows for user access to additional device functionality that may otherwise not be accessible by the user on a reduced-size device with limited real estate for displaying affordances (e.g., on a touch-sensitive display) and/or receiving user input (e.g., via a touch-sensitive display, a touch-sensitive surface, or a physical/mechanical control such as a knob or a button).

As used in the specification and claims, the term "tactile output" refers to physical displacement of a device relative to a previous position of the device, physical displacement of a component (e.g., a touch-sensitive surface) of a device relative to another component (e.g., housing) of the device, or displacement of the component relative to a center of mass of the device that will be detected by a user with the user's sense of touch. For example, in situations where the device or the component of the device is in contact with a surface of a user that is sensitive to touch (e.g., a finger, palm, or other part of a user's hand), the tactile output generated by the physical displacement will be interpreted by the user as a tactile sensation corresponding to a perceived change in physical characteristics of the device or component of the device. For example, movement of a touch-sensitive surface (e.g., a touch-sensitive display or trackpad) is, optionally, interpreted by the user as a "down click" or "up click" of a physical actuator button. In some cases, a user will feel a tactile sensation such as an "down click" or "up click" even when there is no movement of a physical actuator button associated with the touch-sensitive surface that is physically pressed (e.g., displaced) by the user's movements. As another example, movement of the touch-sensitive surface is, optionally, interpreted or sensed by the user as "roughness" of the touch-sensitive surface, even when there is no change in smoothness of the touch-sensitive surface. While such interpretations of touch by a user will be subject to the individualized sensory perceptions of the user, there are many sensory perceptions of touch that are common to a large majority of users. Thus, when a tactile output is described as corresponding to a particular sensory perception of a user (e.g., an "up click," a "down click," "roughness"), unless otherwise stated, the generated tactile output corresponds to physical displacement of the device or a component thereof that will generate the described sensory perception for a typical (or average) user.

It should be appreciated that device 100 is only one example of a portable multifunction device, and that device 100 optionally has more or fewer components than shown, optionally combines two or more components, or optionally has a different configuration or arrangement of the components. The various components shown in FIG. 1A are implemented in hardware, software, or a combination of both hardware and software, including one or more signal processing and/or application-specific integrated circuits.

Memory 102 may include one or more computer-readable storage mediums. The computer-readable storage mediums may be tangible and non-transitory. Memory 102 may include high-speed random access memory and may also include non-volatile memory, such as one or more magnetic disk storage devices, flash memory devices, or other non-volatile solid-state memory devices. Memory controller 122 may control access to memory 102 by other components of device 100.

Peripherals interface 118 can be used to couple input and output peripherals of the device to CPU 120 and memory 102. The one or more processors 120 run or execute various software programs and/or sets of instructions stored in memory 102 to perform various functions for device 100 and to process data. In some embodiments, peripherals interface 118, CPU 120, and memory controller 122 may be implemented on a single chip, such as chip 104. In some other embodiments, they may be implemented on separate chips.

RF (radio frequency) circuitry 108 receives and sends RF signals, also called electromagnetic signals. RF circuitry 108 converts electrical signals to/from electromagnetic signals and communicates with communications networks and other communications devices via the electromagnetic signals. RF circuitry 108 optionally includes well-known circuitry for performing these functions, including but not limited to an antenna system, an RF transceiver, one or more amplifiers, a tuner, one or more oscillators, a digital signal processor, a CODEC chipset, a subscriber identity module (SIM) card, memory, and so forth. RF circuitry 108 optionally communicates with networks, such as the Internet, also referred to as the World Wide Web (WWW), an intranet and/or a wireless network, such as a cellular telephone network, a wireless local area network (LAN) and/or a metropolitan area network (MAN), and other devices by wireless communication. The RF circuitry 108 optionally includes well-known circuitry for detecting near field communication (NFC) fields, such as by a short-range communication radio. The wireless communication optionally uses any of a plurality of communications standards, protocols, and technologies, including but not limited to Global System for Mobile Communications (GSM), Enhanced Data GSM Environment (EDGE), high-speed downlink packet access (HSDPA), high-speed uplink packet access (HSUPA), Evolution, Data-Only (EV-DO), HSPA, HSPA+, Dual-Cell HSPA (DC-HSPDA), long term evolution (LTE), near field communication (NFC), wideband code division multiple access (W-CDMA), code division multiple access (CDMA), time division multiple access (TDMA), Bluetooth, Bluetooth Low Energy (BTLE), Wireless Fidelity (Wi-Fi) (e.g., IEEE 802.11a, IEEE 802.11b, IEEE 802.11g, IEEE 802.11n, and/or IEEE 802.11ac), voice over Internet Protocol (VoIP), Wi-MAX, a protocol for e-mail (e.g., Internet message access protocol (IMAP) and/or post office protocol (POP)), instant messaging (e.g., extensible messaging and presence protocol (XMPP), Session Initiation Protocol for Instant Messaging and Presence Leveraging Extensions (SIMPLE), Instant Messaging and Presence Service (IMPS)), and/or Short Message Service (SMS), or any other suitable communication protocol, including communication protocols not yet developed as of the filing date of this document.

Audio circuitry 110, speaker 111, and microphone 113 provide an audio interface between a user and device 100. Audio circuitry 110 receives audio data from peripherals interface 118, converts the audio data to an electrical signal, and transmits the electrical signal to speaker 111. Speaker 111 converts the electrical signal to human-audible sound waves. Audio circuitry 110 also receives electrical signals converted by microphone 113 from sound waves. Audio circuitry 110 converts the electrical signal to audio data and transmits the audio data to peripherals interface 118 for processing. Audio data may be retrieved from and/or transmitted to memory 102 and/or RF circuitry 108 by peripherals interface 118. In some embodiments, audio circuitry 110 also includes a headset jack (e.g., 212, FIG. 2). The headset jack provides an interface between audio circuitry 110 and removable audio input/output peripherals, such as output-only headphones or a headset with both output (e.g., a headphone for one or both ears) and input (e.g., a microphone).

I/O subsystem 106 couples input/output peripherals on device 100, such as touch screen 112 and other input control devices 116, to peripherals interface 118. I/O subsystem 106 optionally includes display controller 156, optical sensor controller 158, intensity sensor controller 159, haptic feedback controller 161, and one or more input controllers 160 for other input or control devices. The one or more input controllers 160 receive/send electrical signals from/to other input control devices 116. The other input control devices 116 optionally include physical buttons (e.g., push buttons, rocker buttons, etc.), dials, slider switches, joysticks, click wheels, and so forth. In some alternate embodiments, input controller(s) 160 are, optionally, coupled to any (or none) of the following: a keyboard, an infrared port, a USB port, and a pointer device such as a mouse. The one or more buttons (e.g., 208, FIG. 2) optionally include an up/down button for volume control of speaker 111 and/or microphone 113. The one or more buttons optionally include a push button (e.g., 206, FIG. 2).

A quick press of the push button may disengage a lock of touch screen 112 or begin a process that uses gestures on the touch screen to unlock the device, as described in U.S. patent application Ser. No. 11/322,549, "Unlocking a Device by Performing Gestures on an Unlock Image," filed Dec. 23, 2005, U.S. Pat. No. 7,657,849, which is hereby incorporated by reference in its entirety. A longer press of the push button (e.g., 206) may turn power to device 100 on or off. The user may be able to customize a functionality of one or more of the buttons. Touch screen 112 is used to implement virtual or soft buttons and one or more soft keyboards.

Touch-sensitive display 112 provides an input interface and an output interface between the device and a user. Display controller 156 receives and/or sends electrical signals from/to touch screen 112. Touch screen 112 displays visual output to the user. The visual output may include graphics, text, icons, video, and any combination thereof (collectively termed "graphics"). In some embodiments, some or all of the visual output may correspond to user-interface objects.

Touch screen 112 has a touch-sensitive surface, sensor, or set of sensors that accepts input from the user based on haptic and/or tactile contact. Touch screen 112 and display controller 156 (along with any associated modules and/or sets of instructions in memory 102) detect contact (and any movement or breaking of the contact) on touch screen 112 and convert the detected contact into interaction with user-interface objects (e.g., one or more soft keys, icons, web pages, or images) that are displayed on touch screen 112. In an exemplary embodiment, a point of contact between touch screen 112 and the user corresponds to a finger of the user.

Touch screen 112 may use LCD (liquid crystal display) technology, LPD (light emitting polymer display) technology, or LED (light emitting diode) technology, although other display technologies may be used in other embodiments. Touch screen 112 and display controller 156 may detect contact and any movement or breaking thereof using any of a plurality of touch sensing technologies now known or later developed, including but not limited to capacitive, resistive, infrared, and surface acoustic wave technologies, as well as other proximity sensor arrays or other elements for determining one or more points of contact with touch screen 112. In an exemplary embodiment, projected mutual capacitance sensing technology is used, such as that found in the iPhone® and iPod Touch® from Apple Inc. of Cupertino, Calif.

A touch-sensitive display in some embodiments of touch screen 112 may be analogous to the multi-touch sensitive touchpads described in the following U.S. Pat. No. 6,323,846 (Westerman et al.), U.S. Pat. No. 6,570,557 (Westerman et al.), and/or U.S. Pat. No. 6,677,932 (Westerman), and/or U.S. Patent Publication 2002/0015024A1, each of which is hereby incorporated by reference in its entirety. However, touch screen 112 displays visual output from device 100, whereas touch-sensitive touchpads do not provide visual output.

A touch-sensitive display in some embodiments of touch screen 112 may be as described in the following applications: (1) U.S. patent application Ser. No. 11/381,313, "Multipoint Touch Surface Controller," filed May 2, 2006; (2) U.S. patent application Ser. No. 10/840,862, "Multipoint Touchscreen," filed May 6, 2004; (3) U.S. patent application Ser. No. 10/903,964, "Gestures For Touch Sensitive Input Devices," filed Jul. 30, 2004; (4) U.S. patent application Ser. No. 11/048,264, "Gestures For Touch Sensitive Input Devices," filed Jan. 31, 2005; (5) U.S. patent application Ser. No. 11/038,590, "Mode-Based Graphical User Interfaces For Touch Sensitive Input Devices," filed Jan. 18, 2005; (6) U.S. patent application Ser. No. 11/228,758, "Virtual Input Device Placement On A Touch Screen User Interface," filed Sep. 16, 2005; (7) U.S. patent application Ser. No. 11/228,700, "Operation Of A Computer With A Touch Screen Interface," filed Sep. 16, 2005; (8) U.S. patent application Ser. No. 11/228,737, "Activating Virtual Keys Of A Touch-Screen Virtual Keyboard," filed Sep. 16, 2005; and (9) U.S. patent application Ser. No. 11/367,749, "Multi-Functional Hand-Held Device," filed Mar. 3, 2006. All of these applications are incorporated by reference herein in their entirety.

Touch screen 112 may have a video resolution in excess of 100 dpi. In some embodiments, the touch screen has a video resolution of approximately 160 dpi. The user may make contact with touch screen 112 using any suitable object or appendage, such as a stylus, a finger, and so forth. In some embodiments, the user interface is designed to work primarily with finger-based contacts and gestures, which can be less precise than stylus-based input due to the larger area of contact of a finger on the touch screen. In some embodiments, the device translates the rough finger-based input into a precise pointer/cursor position or command for performing the actions desired by the user.

In some embodiments, in addition to the touch screen, device 100 may include a touchpad (not shown) for activating or deactivating particular functions. In some embodiments, the touchpad is a touch-sensitive area of the device that, unlike the touch screen, does not display visual output. The touchpad may be a touch-sensitive surface that is separate from touch screen 112 or an extension of the touch-sensitive surface formed by the touch screen.

Device 100 also includes power system 162 for powering the various components. Power system 162 may include a power management system, one or more power sources (e.g., battery, alternating current (AC)), a recharging system, a power failure detection circuit, a power converter or inverter, a power status indicator (e.g., a light-emitting diode (LED)) and any other components associated with the generation, management and distribution of power in portable devices.

Device 100 may also include one or more optical sensors 164. FIG. 1A shows an optical sensor coupled to optical sensor controller 158 in I/O subsystem 106. Optical sensor 164 may include charge-coupled device (CCD) or complementary metal-oxide semiconductor (CMOS) phototransistors. Optical sensor 164 receives light from the environment, projected through one or more lenses, and converts the light to data representing an image. In conjunction with imaging module 143 (also called a camera module), optical sensor 164 may capture still images or video. In some embodiments, an optical sensor is located on the back of device 100, opposite touch screen display 112 on the front of the device so that the touch screen display may be used as a viewfinder for still and/or video image acquisition. In some embodiments, an optical sensor is located on the front of the device so that the user's image may be obtained for video conferencing while the user views the other video conference participants on the touch screen display. In some embodiments, the position of optical sensor 164 can be changed by the user (e.g., by rotating the lens and the sensor in the device housing) so that a single optical sensor 164 may be used along with the touch screen display for both video conferencing and still and/or video image acquisition.

Device 100 optionally also includes one or more contact intensity sensors 165. FIG. 1A shows a contact intensity sensor coupled to intensity sensor controller 159 in I/O subsystem 106. Contact intensity sensor 165 optionally includes one or more piezoresistive strain gauges, capacitive force sensors, electric force sensors, piezoelectric force sensors, optical force sensors, capacitive touch-sensitive surfaces, or other intensity sensors (e.g., sensors used to measure the force (or pressure) of a contact on a touch-sensitive surface). Contact intensity sensor 165 receives contact intensity information (e.g., pressure information or a proxy for pressure information) from the environment. In some embodiments, at least one contact intensity sensor is collocated with, or proximate to, a touch-sensitive surface (e.g., touch-sensitive display system 112). In some embodiments, at least one contact intensity sensor is located on the back of device 100, opposite touch screen display 112, which is located on the front of device 100.

Device 100 may also include one or more proximity sensors 166. FIG. 1A shows proximity sensor 166 coupled to peripherals interface 118. Alternately, proximity sensor 166 may be coupled to input controller 160 in I/O subsystem 106. Proximity sensor 166 may perform as described in U.S. patent application Ser. No. 11/241,839, "Proximity Detector In Handheld Device"; Ser. No. 11/240,788, "Proximity Detector In Handheld Device"; Ser. No. 11/620,702, "Using Ambient Light Sensor To Augment Proximity Sensor Output"; Ser. No. 11/586,862, "Automated Response To And Sensing Of User Activity In Portable Devices"; and Ser. No. 11/638,251, "Methods And Systems For Automatic Configuration Of Peripherals," which are hereby incorporated by reference in their entirety. In some embodiments, the proximity sensor turns off and disables touch screen 112 when the multifunction device is placed near the user's ear (e.g., when the user is making a phone call).

Device 100 optionally also includes one or more tactile output generators 167. FIG. 1A shows a tactile output generator coupled to haptic feedback controller 161 in I/O subsystem 106. Tactile output generator 167 optionally includes one or more electroacoustic devices such as speakers or other audio components and/or electromechanical devices that convert energy into linear motion such as a motor, solenoid, electroactive polymer, piezoelectric actuator, electrostatic actuator, or other tactile output generating component (e.g., a component that converts electrical signals into tactile outputs on the device). Contact intensity sensor 165 receives tactile feedback generation instructions from haptic feedback module 133 and generates tactile outputs on device 100 that are capable of being sensed by a user of device 100. In some embodiments, at least one tactile output generator is collocated with, or proximate to, a touch-sensitive surface (e.g., touch-sensitive display system 112) and, optionally, generates a tactile output by moving the touch-sensitive surface vertically (e.g., in/out of a surface of device 100) or laterally (e.g., back and forth in the same plane as a surface of device 100). In some embodiments, at least one tactile output generator sensor is located on the back of device 100, opposite touch screen display 112, which is located on the front of device 100.

Device 100 may also include one or more accelerometers 168. FIG. 1A shows accelerometer 168 coupled to peripherals interface 118. Alternately, accelerometer 168 may be coupled to an input controller 160 in I/O subsystem 106. Accelerometer 168 may perform as described in U.S. Patent Publication No. 20050190059, "Acceleration-based Theft Detection System for Portable Electronic Devices," and U.S. Patent Publication No. 20060017692, "Methods And Apparatuses For Operating A Portable Device Based On An Accelerometer," both of which are incorporated by reference herein in their entirety. In some embodiments, information is displayed on the touch screen display in a portrait view or a landscape view based on an analysis of data received from the one or more accelerometers. Device 100 optionally includes, in addition to accelerometer(s) 168, a magnetometer (not shown) and a GPS (or GLONASS or other global navigation system) receiver (not shown) for obtaining information concerning the location and orientation (e.g., portrait or landscape) of device 100.

Figure 3:
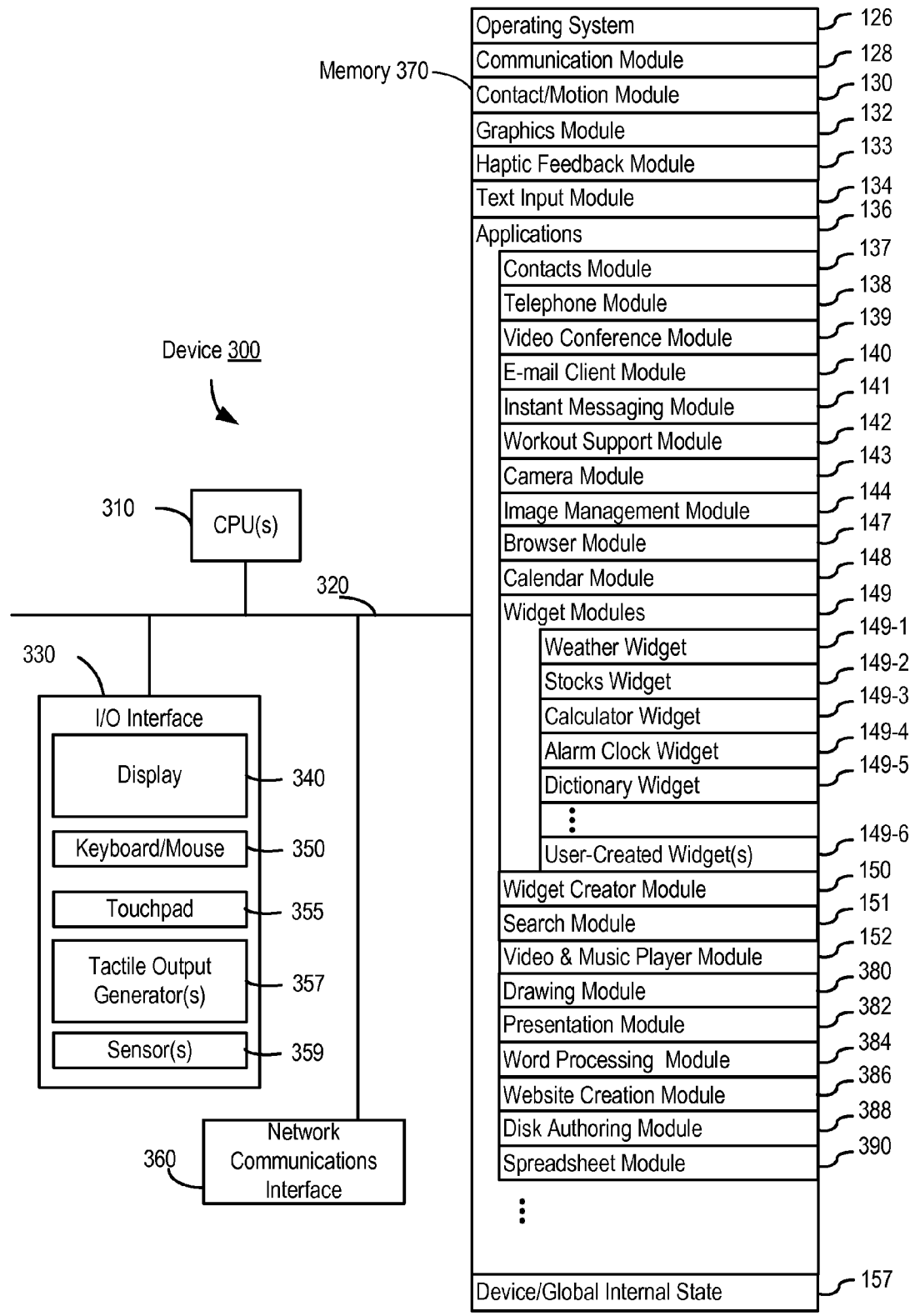
FIG. 3 is a block diagram of an exemplary multifunction device with a display and a touch-sensitive surface in accordance with some embodiments.

In some embodiments, the software components stored in memory 102 include operating system 126, communication module (or set of instructions) 128, contact/motion module (or set of instructions) 130, graphics module (or set of instructions) 132, text input module (or set of instructions) 134, Global Positioning System (GPS) module (or set of instructions) 135, and applications (or sets of instructions) 136. Furthermore, in some embodiments, memory 102 (FIG. 1A) or 370 (FIG. 3) stores device/global internal state 157, as shown in FIGS. 1A and 3. Device/global internal state 157 includes one or more of: active application state, indicating which applications, if any, are currently active; display state, indicating what applications, views or other information occupy various regions of touch screen display 112; sensor state, including information obtained from the device's various sensors and input control devices 116; and location information concerning the device's location and/or attitude.

Operating system 126 (e.g., Darwin, RTXC, LINUX, UNIX, OS X, iOS, WINDOWS, or an embedded operating system such as VxWorks) includes various software components and/or drivers for controlling and managing general system tasks (e.g., memory management, storage device control, power management, etc.) and facilitates communication between various hardware and software components.

Communication module 128 facilitates communication with other devices over one or more external ports 124 and also includes various software components for handling data received by RF circuitry 108 and/or external port 124. External port 124 (e.g., Universal Serial Bus (USB), FIREWIRE, etc.) is adapted for coupling directly to other devices or indirectly over a network (e.g., the Internet, wireless LAN, etc.). In some embodiments, the external port is a multi-pin (e.g., 30-pin) connector that is the same as, or similar to and/or compatible with, the 30-pin connector used on iPod® (trademark of Apple Inc.) devices.

Contact/motion module 130 optionally detects contact with touch screen 112 (in conjunction with display controller 156) and other touch-sensitive devices (e.g., a touchpad or physical click wheel). Contact/motion module 130 includes various software components for performing various operations related to detection of contact, such as determining if contact has occurred (e.g., detecting a finger-down event), determining an intensity of the contact (e.g., the force or pressure of the contact or a substitute for the force or pressure of the contact), determining if there is movement of the contact and tracking the movement across the touch-sensitive surface (e.g., detecting one or more finger-dragging events), and determining if the contact has ceased (e.g., detecting a finger-up event or a break in contact). Contact/motion module 130 receives contact data from the touch-sensitive surface. Determining movement of the point of contact, which is represented by a series of contact data, optionally includes determining speed (magnitude), velocity (magnitude and direction), and/or an acceleration (a change in magnitude and/or direction) of the point of contact. These operations are, optionally, applied to single contacts (e.g., one finger contacts) or to multiple simultaneous contacts (e.g., "multitouch"/multiple finger contacts). In some embodiments, contact/motion module 130 and display controller 156 detect contact on a touchpad.

In some embodiments, contact/motion module 130 uses a set of one or more intensity thresholds to determine whether an operation has been performed by a user (e.g., to determine whether a user has "clicked" on an icon). In some embodiments, at least a subset of the intensity thresholds are determined in accordance with software parameters (e.g., the intensity thresholds are not determined by the activation thresholds of particular physical actuators and can be adjusted without changing the physical hardware of device 100). For example, a mouse "click" threshold of a trackpad or touch screen display can be set to any of a large range of predefined threshold values without changing the trackpad or touch screen display hardware. Additionally, in some implementations, a user of the device is provided with software settings for adjusting one or more of the set of intensity thresholds (e.g., by adjusting individual intensity thresholds and/or by adjusting a plurality of intensity thresholds at once with a system-level click "intensity" parameter).

Contact/motion module 130 optionally detects a gesture input by a user. Different gestures on the touch-sensitive surface have different contact patterns (e.g., different motions, timings, and/or intensities of detected contacts). Thus, a gesture is, optionally, detected by detecting a particular contact pattern. For example, detecting a finger tap gesture includes detecting a finger-down event followed by detecting a finger-up (liftoff) event at the same position (or substantially the same position) as the finger-down event (e.g., at the position of an icon). As another example, detecting a finger swipe gesture on the touch-sensitive surface includes detecting a finger-down event followed by detecting one or more finger-dragging events, and subsequently followed by detecting a finger-up (liftoff) event.

Graphics module 132 includes various known software components for rendering and displaying graphics on touch screen 112 or other display, including components for changing the visual impact (e.g., brightness, transparency, saturation, contrast, or other visual property) of graphics that are displayed. As used herein, the term "graphics" includes any object that can be displayed to a user, including, without limitation, text, web pages, icons (such as user-interface objects including soft keys), digital images, videos, animations, and the like.

In some embodiments, graphics module 132 stores data representing graphics to be used. Each graphic is, optionally, assigned a corresponding code. Graphics module 132 receives, from applications etc., one or more codes specifying graphics to be displayed along with, if necessary, coordinate data and other graphic property data, and then generates screen image data to output to display controller 156.

Haptic feedback module 133 includes various software components for generating instructions used by tactile output generator(s) 167 to produce tactile outputs at one or more locations on device 100 in response to user interactions with device 100.

Text input module 134, which may be a component of graphics module 132, provides soft keyboards for entering text in various applications (e.g., contacts 137, e-mail 140, IM 141, browser 147, and any other application that needs text input).

GPS module 135 determines the location of the device and provides this information for use in various applications (e.g., to telephone 138 for use in location-based dialing; to camera 143 as picture/video metadata; and to applications that provide location-based services such as weather widgets, local yellow page widgets, and map/navigation widgets).

Applications 136 may include the following modules (or sets of instructions), or a subset or superset thereof:

Contacts module 137 (sometimes called an address book or contact list);

Telephone module 138;
Video conferencing module 139;
E-mail client module 140;
Instant messaging (IM) module 141;
Workout support module 142;
Camera module 143 for still and/or video images;
Image management module 144;
Video player module;
Music player module;
Browser module 147;
Calendar module 148;
Widget modules 149, which may include one or more of: weather widget 149-1, stocks widget 149-2, calculator widget 149-3, alarm clock widget 149-4, dictionary widget 149-5, and other widgets obtained by the user, as well as user-created widgets 149-6;
Widget creator module 150 for making user-created widgets 149-6;
Search module 151;
Video and music player module 152, which merges video player module and music player module;
Notes module 153;
Map module 154; and/or
Online video module 155.

Examples of other applications 136 that may be stored in memory 102 include other word processing applications, other image editing applications, drawing applications, presentation applications, JAVA-enabled applications, encryption, digital rights management, voice recognition, and voice replication.

In conjunction with touch screen 112, display controller 156, contact/motion module 130, graphics module 132, and text input module 134, contacts module 137 may be used to manage an address book or contact list (e.g., stored in application internal state 192 of contacts module 137 in memory 102 or memory 370), including: adding name(s) to the address book; deleting name(s) from the address book; associating telephone number(s), e-mail address(es), physical address(es) or other information with a name; associating an image with a name; categorizing and sorting names; providing telephone numbers or e-mail addresses to initiate and/or facilitate communications by telephone 138, video conference 139, e-mail 140, or IM 141; and so forth.

In conjunction with RF circuitry 108, audio circuitry 110, speaker 111, microphone 113, touch screen 112, display controller 156, contact/motion module 130, graphics module 132, and text input module 134, telephone module 138 may be used to enter a sequence of characters corresponding to a telephone number, access one or more telephone numbers in contacts module 137, modify a telephone number that has been entered, dial a respective telephone number, conduct a conversation, and disconnect or hang up when the conversation is completed. As noted above, the wireless communication may use any of a plurality of communications standards, protocols, and technologies.

In conjunction with RF circuitry 108, audio circuitry 110, speaker 111, microphone 113, touch screen 112, display controller 156, optical sensor 164, optical sensor controller 158, contact/motion module 130, graphics module 132, text input module 134, contacts module 137, and telephone module 138, video conference module 139 includes executable instructions to initiate, conduct, and terminate a video conference between a user and one or more other participants in accordance with user instructions.

In conjunction with RF circuitry 108, touch screen 112, display controller 156, contact/motion module 130, graphics module 132, and text input module 134, e-mail client module 140 includes executable instructions to create, send, receive, and manage e-mail in response to user instructions. In conjunction with image management module 144, e-mail client module 140 makes it very easy to create and send e-mails with still or video images taken with camera module 143.

In conjunction with RF circuitry 108, touch screen 112, display controller 156, contact/motion module 130, graphics module 132, and text input module 134, the instant messaging module 141 includes executable instructions to enter a sequence of characters corresponding to an instant message, to modify previously entered characters, to transmit a respective instant message (for example, using a Short Message Service (SMS) or Multimedia Message Service (MMS) protocol for telephony-based instant messages or using XMPP, SIMPLE, or IMPS for Internet-based instant messages), to receive instant messages, and to view received instant messages. In some embodiments, transmitted and/or received instant messages may include graphics, photos, audio files, video files and/or other attachments as are supported in an MMS and/or an Enhanced Messaging Service (EMS). As used herein, "instant messaging" refers to both telephony-based messages (e.g., messages sent using SMS or MMS) and Internet-based messages (e.g., messages sent using XMPP, SIMPLE, or IMPS).

In conjunction with RF circuitry 108, touch screen 112, display controller 156, contact/motion module 130, graphics module 132, text input module 134, GPS module 135, map module 154, and music player module, workout support module 142 includes executable instructions to create workouts (e.g., with time, distance, and/or calorie burning goals); communicate with workout sensors (sports devices); receive workout sensor data; calibrate sensors used to monitor a workout; select and play music for a workout; and display, store, and transmit workout data.

In conjunction with touch screen 112, display controller 156, optical sensor(s) 164, optical sensor controller 158, contact/motion module 130, graphics module 132, and image management module 144, camera module 143 includes executable instructions to capture still images or video (including a video stream) and store them into memory 102, modify characteristics of a still image or video, or delete a still image or video from memory 102.

In conjunction with touch screen 112, display controller 156, contact/motion module 130, graphics module 132, text input module 134, and camera module 143, image management module 144 includes executable instructions to arrange, modify (e.g., edit), or otherwise manipulate, label, delete, present (e.g., in a digital slide show or album), and store still and/or video images.

In conjunction with RF circuitry 108, touch screen 112, display controller 156, contact/motion module 130, graphics module 132, and text input module 134, browser module 147 includes executable instructions to browse the Internet in accordance with user instructions, including searching, linking to, receiving, and displaying web pages or portions thereof, as well as attachments and other files linked to web pages.

In conjunction with RF circuitry 108, touch screen 112, display controller 156, contact/motion module 130, graphics module 132, text input module 134, e-mail client module 140, and browser module 147, calendar module 148 includes executable instructions to create, display, modify, and store calendars and data associated with calendars (e.g., calendar entries, to-do lists, etc.) in accordance with user instructions.

In conjunction with RF circuitry 108, touch screen 112, display controller 156, contact/motion module 130, graphics module 132, text input module 134, and browser module 147, widget modules 149 are mini-applications that may be downloaded and used by a user (e.g., weather widget 149-1, stocks widget 149-2, calculator widget 149-3, alarm clock widget 149-4, and dictionary widget 149-5) or created by the user (e.g., user-created widget 149-6). In some embodiments, a widget includes an HTML (Hypertext Markup Language) file, a CSS (Cascading Style Sheets) file, and a JavaScript file. In some embodiments, a widget includes an XML (Extensible Markup Language) file and a JavaScript file (e.g., Yahoo! Widgets).

In conjunction with RF circuitry 108, touch screen 112, display controller 156, contact/motion module 130, graphics module 132, text input module 134, and browser module 147, the widget creator module 150 may be used by a user to create widgets (e.g., turning a user-specified portion of a web page into a widget).

In conjunction with touch screen 112, display controller 156, contact/motion module 130, graphics module 132, and text input module 134, search module 151 includes executable instructions to search for text, music, sound, image, video, and/or other files in memory 102 that match one or more search criteria (e.g., one or more user-specified search terms) in accordance with user instructions.

In conjunction with touch screen 112, display controller 156, contact/motion module 130, graphics module 132, audio circuitry 110, speaker 111, RF circuitry 108, and browser module 147, video and music player module 152 includes executable instructions that allow the user to download and play back recorded music and other sound files stored in one or more file formats, such as MP3 or AAC files, and executable instructions to display, present, or otherwise play back videos (e.g., on touch screen 112 or on an external, connected display via external port 124). In some embodiments, device 100 optionally includes the functionality of an MP3 player, such as an iPod (trademark of Apple Inc.).

In conjunction with touch screen 112, display controller 156, contact/motion module 130, graphics module 132, and text input module 134, notes module 153 includes executable instructions to create and manage notes, to-do lists, and the like in accordance with user instructions.

In conjunction with RF circuitry 108, touch screen 112, display controller 156, contact module 130, graphics module 132, text input module 134, GPS module 135, and browser module 147, map module 154 may be used to receive, display, modify, and store maps and data associated with maps (e.g., driving directions, data on stores and other points of interest at or near a particular location, and other location-based data) in accordance with user instructions.

In conjunction with touch screen 112, display controller 156, contact module 130, graphics module 132, audio circuitry 110, speaker 111, RF circuitry 108, text input module 134, e-mail client module 140, and browser module 147, online video module 155 includes instructions that allow the user to access, browse, receive (e.g., by streaming and/or download), play back (e.g., on the touch screen or on an external, connected display via external port 124), send an e-mail with a link to a particular online video, and otherwise manage online videos in one or more file formats, such as H.264. In some embodiments, instant messaging module 141, rather than e-mail client module 140, is used to send a link to a particular online video. Additional description of the online video application can be found in U.S. Provisional Patent Application No. 60/936,562, "Portable Multifunction Device, Method, and Graphical User Interface for Playing Online Videos," filed Jun. 20, 2007, and U.S. patent application Ser. No. 11/968,067, "Portable Multifunction Device, Method, and Graphical User Interface for Playing Online Videos," filed Dec. 31, 2007, the contents of which are hereby incorporated by reference in their entirety.

Each of the above-identified modules and applications corresponds to a set of executable instructions for performing one or more functions described above and the methods described in this application (e.g., the computer-implemented methods and other information processing methods described herein). These modules (e.g., sets of instructions) need not be implemented as separate software programs, procedures, or modules, and thus various subsets of these modules may be combined or otherwise rearranged in various embodiments. For example, video player module may be combined with music player module into a single module (e.g., video and music player module 152, FIG. 1A). In some embodiments, memory 102 may store a subset of the modules and data structures identified above. Furthermore, memory 102 may store additional modules and data structures not described above.

In some embodiments, device 100 is a device where operation of a predefined set of functions on the device is performed exclusively through a touch screen and/or a touchpad. By using a touch screen and/or a touchpad as the primary input control device for operation of device 100, the number of physical input control devices (such as push buttons, dials, and the like) on device 100 may be reduced.

The predefined set of functions that are performed exclusively through a touch screen and/or a touchpad optionally include navigation between user interfaces. In some embodiments, the touchpad, when touched by the user, navigates device 100 to a main, home, or root menu from any user interface that is displayed on device 100. In such embodiments, a "menu button" is implemented using a touchpad. In some other embodiments, the menu button is a physical push button or other physical input control device instead of a touchpad.

Figure 1B:
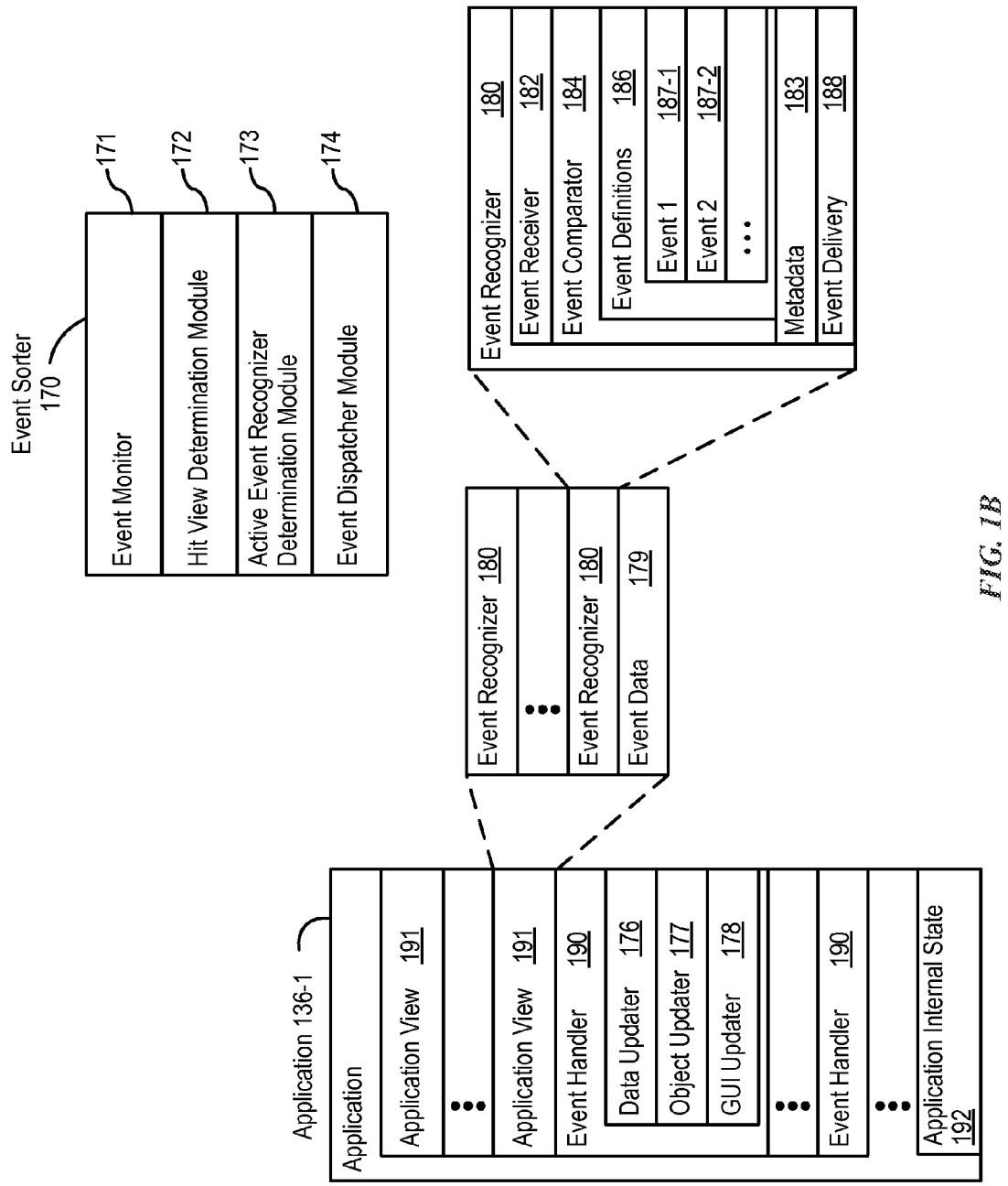
FIG. 1B is a block diagram illustrating exemplary components for event handling in accordance with some embodiments.

FIG. 1B is a block diagram illustrating exemplary components for event handling in accordance with some embodiments. In some embodiments, memory 102 (FIG. 1A) or 370 (FIG. 3) includes event sorter 170 (e.g., in operating system 126) and a respective application 136-1 (e.g., any of the aforementioned applications 137-151, 155, 380-390).

Event sorter 170 receives event information and determines the application 136-1 and application view 191 of application 136-1 to which to deliver the event information. Event sorter 170 includes event monitor 171 and event dispatcher module 174. In some embodiments, application 136-1 includes application internal state 192, which indicates the current application view(s) displayed on touch-sensitive display 112 when the application is active or executing. In some embodiments, device/global internal state 157 is used by event sorter 170 to determine which application(s) is (are) currently active, and application internal state 192 is used by event sorter 170 to determine application views 191 to which to deliver event information.

In some embodiments, application internal state 192 includes additional information, such as one or more of: resume information to be used when application 136-1 resumes execution, user interface state information that indicates information being displayed or that is ready for display by application 136-1, a state queue for enabling the user to go back to a prior state or view of application 136-1, and a redo/undo queue of previous actions taken by the user.

Event monitor 171 receives event information from peripherals interface 118. Event information includes information about a sub-event (e.g., a user touch on touch-sensitive display 112, as part of a multi-touch gesture). Peripherals interface 118 transmits information it receives from I/O subsystem 106 or a sensor, such as proximity sensor 166, accelerometer(s) 168, and/or microphone 113 (through audio circuitry 110). Information that peripherals interface 118 receives from I/O subsystem 106 includes information from touch-sensitive display 112 or a touch-sensitive surface.

In some embodiments, event monitor 171 sends requests to the peripherals interface 118 at predetermined intervals. In response, peripherals interface 118 transmits event information. In other embodiments, peripherals interface 118 transmits event information only when there is a significant event (e.g., receiving an input above a predetermined noise threshold and/or for more than a predetermined duration).

In some embodiments, event sorter 170 also includes a hit view determination module 172 and/or an active event recognizer determination module 173.

Hit view determination module 172 provides software procedures for determining where a sub-event has taken place within one or more views when touch-sensitive display 112 displays more than one view. Views are made up of controls and other elements that a user can see on the display.

Another aspect of the user interface associated with an application is a set of views, sometimes herein called application views or user interface windows, in which information is displayed and touch-based gestures occur. The application views (of a respective application) in which a touch is detected may correspond to programmatic levels within a programmatic or view hierarchy of the application. For example, the lowest level view in which a touch is detected may be called the hit view, and the set of events that are recognized as proper inputs may be determined based, at least in part, on the hit view of the initial touch that begins a touch-based gesture.

Hit view determination module 172 receives information related to sub-events of a touch-based gesture. When an application has multiple views organized in a hierarchy, hit view determination module 172 identifies a hit view as the lowest view in the hierarchy which should handle the sub-event. In most circumstances, the hit view is the lowest level view in which an initiating sub-event occurs (e.g., the first sub-event in the sequence of sub-events that form an event or potential event). Once the hit view is identified by the hit view determination module 172, the hit view typically receives all sub-events related to the same touch or input source for which it was identified as the hit view.

Active event recognizer determination module 173 determines which view or views within a view hierarchy should receive a particular sequence of sub-events. In some embodiments, active event recognizer determination module 173 determines that only the hit view should receive a particular sequence of sub-events. In other embodiments, active event recognizer determination module 173 determines that all views that include the physical location of a sub-event are actively involved views, and therefore determines that all actively involved views should receive a particular sequence of sub-events. In other embodiments, even if touch sub-events were entirely confined to the area associated with one particular view, views higher in the hierarchy would still remain as actively involved views.

Event dispatcher module 174 dispatches the event information to an event recognizer (e.g., event recognizer 180). In embodiments including active event recognizer determination module 173, event dispatcher module 174 delivers the event information to an event recognizer determined by active event recognizer determination module 173. In some embodiments, event dispatcher module 174 stores in an event queue the event information, which is retrieved by a respective event receiver 182.

In some embodiments, operating system 126 includes event sorter 170. Alternatively, application 136-1 includes event sorter 170. In yet other embodiments, event sorter 170 is a stand-alone module, or a part of another module stored in memory 102, such as contact/motion module 130.

In some embodiments, application 136-1 includes a plurality of event handlers 190 and one or more application views 191, each of which includes instructions for handling touch events that occur within a respective view of the application's user interface. Each application view 191 of the application 136-1 includes one or more event recognizers 180. Typically, a respective application view 191 includes a plurality of event recognizers 180. In other embodiments, one or more of event recognizers 180 are part of a separate module, such as a user interface kit (not shown) or a higher level object from which application 136-1 inherits methods and other properties. In some embodiments, a respective event handler 190 includes one or more of: data updater 176, object updater 177, GUI updater 178, and/or event data 179 received from event sorter 170. Event handler 190 may utilize or call data updater 176, object updater 177, or GUI updater 178 to update the application internal state 192. Alternatively, one or more of the application views 191 include one or more respective event handlers 190. Also, in some embodiments, one or more of data updater 176, object updater 177, and GUI updater 178 are included in a respective application view 191.

A respective event recognizer 180 receives event information (e.g., event data 179) from event sorter 170 and identifies an event from the event information. Event recognizer 180 includes event receiver 182 and event comparator 184. In some embodiments, event recognizer 180 also includes at least a subset of: metadata 183, and event delivery instructions 188 (which may include sub-event delivery instructions).

Event receiver 182 receives event information from event sorter 170. The event information includes information about a sub-event, for example, a touch or a touch movement. Depending on the sub-event, the event information also includes additional information, such as location of the sub-event. When the sub-event concerns motion of a touch, the event information may also include speed and direction of the sub-event. In some embodiments, events include rotation of the device from one orientation to another (e.g., from a portrait orientation to a landscape orientation, or vice versa), and the event information includes corresponding information about the current orientation (also called device attitude) of the device.

Event comparator 184 compares the event information to predefined event or sub-event definitions and, based on the comparison, determines an event or sub-event, or determines or updates the state of an event or sub-event. In some embodiments, event comparator 184 includes event definitions 186. Event definitions 186 contain definitions of events (e.g., predefined sequences of sub-events), for example, event 1 (187-1), event 2 (187-2), and others. In some embodiments, sub-events in an event (187) include, for example, touch begin, touch end, touch movement, touch cancellation, and multiple touching. In one example, the definition for event 1 (187-1) is a double tap on a displayed object. The double tap, for example, comprises a first touch (touch begin) on the displayed object for a predetermined phase, a first liftoff (touch end) for a predetermined phase, a second touch (touch begin) on the displayed object for a predetermined phase, and a second liftoff (touch end) for a predetermined phase. In another example, the definition for event 2 (187-2) is a dragging on a displayed object. The dragging, for example, comprises a touch (or contact) on the displayed object for a predetermined phase, a movement of the touch across touch-sensitive display 112, and liftoff of the touch (touch end). In some embodiments, the event also includes information for one or more associated event handlers 190.

In some embodiments, event definition 187 includes a definition of an event for a respective user-interface object. In some embodiments, event comparator 184 performs a hit test to determine which user-interface object is associated with a sub-event. For example, in an application view in which three user-interface objects are displayed on touch-sensitive display 112, when a touch is detected on touch-sensitive display 112, event comparator 184 performs a hit test to determine which of the three user-interface objects is associated with the touch (sub-event). If each displayed object is associated with a respective event handler 190, the event comparator uses the result of the hit test to determine which event handler 190 should be activated. For example, event comparator 184 selects an event handler associated with the sub-event and the object triggering the hit test.

In some embodiments, the definition for a respective event (187) also includes delayed actions that delay delivery of the event information until after it has been determined whether the sequence of sub-events does or does not correspond to the event recognizer's event type.

When a respective event recognizer 180 determines that the series of sub-events do not match any of the events in event definitions 186, the respective event recognizer 180 enters an event impossible, event failed, or event ended state, after which it disregards subsequent sub-events of the touch-based gesture. In this situation, other event recognizers, if any, that remain active for the hit view continue to track and process sub-events of an ongoing touch-based gesture.

In some embodiments, a respective event recognizer 180 includes metadata 183 with configurable properties, flags, and/or lists that indicate how the event delivery system should perform sub-event delivery to actively involved event recognizers. In some embodiments, metadata 183 includes configurable properties, flags, and/or lists that indicate how event recognizers may interact, or are enabled to interact, with one another. In some embodiments, metadata 183 includes configurable properties, flags, and/or lists that indicate whether sub-events are delivered to varying levels in the view or programmatic hierarchy.

In some embodiments, a respective event recognizer 180 activates event handler 190 associated with an event when one or more particular sub-events of an event are recognized. In some embodiments, a respective event recognizer 180 delivers event information associated with the event to event handler 190. Activating an event handler 190 is distinct from sending (and deferred sending) sub-events to a respective hit view. In some embodiments, event recognizer 180 throws a flag associated with the recognized event, and event handler 190 associated with the flag catches the flag and performs a predefined process.

In some embodiments, event delivery instructions 188 include sub-event delivery instructions that deliver event information about a sub-event without activating an event handler. Instead, the sub-event delivery instructions deliver event information to event handlers associated with the series of sub-events or to actively involved views. Event handlers associated with the series of sub-events or with actively involved views receive the event information and perform a predetermined process.

In some embodiments, data updater 176 creates and updates data used in application 136-1. For example, data updater 176 updates the telephone number used in contacts module 137, or stores a video file used in video player module. In some embodiments, object updater 177 creates and updates objects used in application 136-1. For example, object updater 177 creates a new user-interface object or updates the position of a user-interface object. GUI updater 178 updates the GUI. For example, GUI updater 178 prepares display information and sends it to graphics module 132 for display on a touch-sensitive display.

In some embodiments, event handler(s) 190 includes or has access to data updater 176, object updater 177, and GUI updater 178. In some embodiments, data updater 176, object updater 177, and GUI updater 178 are included in a single module of a respective application 136-1 or application view 191. In other embodiments, they are included in two or more software modules.

It shall be understood that the foregoing discussion regarding event handling of user touches on touch-sensitive displays also applies to other forms of user inputs to operate multifunction devices 100 with input devices, not all of which are initiated on touch screens. For example, mouse movement and mouse button presses, optionally coordinated with single or multiple keyboard presses or holds; contact movements such as taps, drags, scrolls, etc. on touchpads; pen stylus inputs; movement of the device; oral instructions; detected eye movements; biometric inputs; and/or any combination thereof are optionally utilized as inputs corresponding to sub-events which define an event to be recognized.

Figure 2:
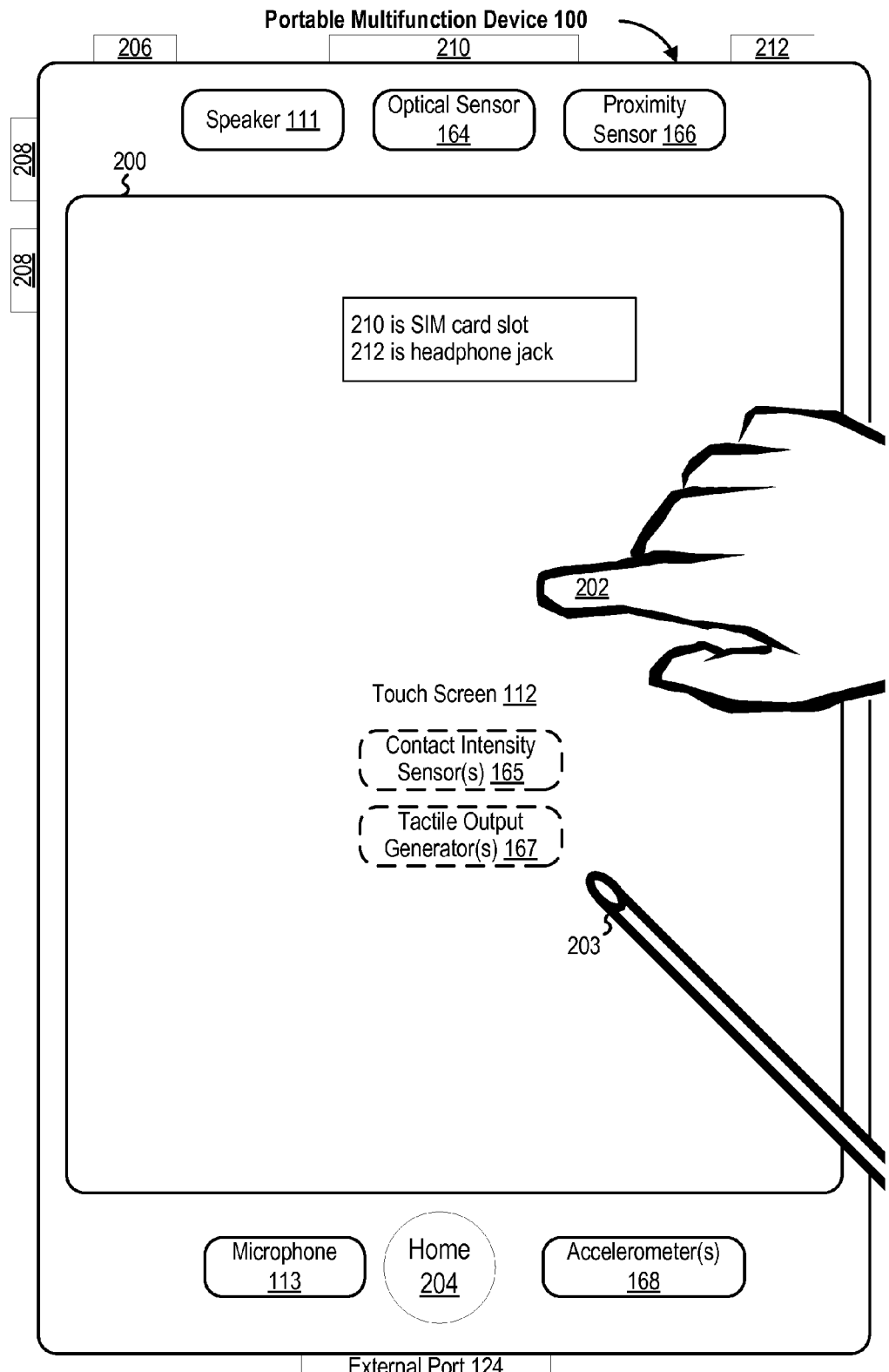
FIG. 2 illustrates a portable multifunction device having a touch screen in accordance with some embodiments.

FIG. 2 illustrates a portable multifunction device 100 having a touch screen 112 in accordance with some embodiments. The touch screen optionally displays one or more graphics within user interface (UI) 200. In this embodiment, as well as others described below, a user is enabled to select one or more of the graphics by making a gesture on the graphics, for example, with one or more fingers 202 (not drawn to scale in the figure) or one or more styluses 203 (not drawn to scale in the figure). In some embodiments, selection of one or more graphics occurs when the user breaks contact with the one or more graphics. In some embodiments, the gesture optionally includes one or more taps, one or more swipes (from left to right, right to left, upward and/or downward), and/or a rolling of a finger (from right to left, left to right, upward and/or downward) that has made contact with device 100. In some implementations or circumstances, inadvertent contact with a graphic does not select the graphic. For example, a swipe gesture that sweeps over an application icon optionally does not select the corresponding application when the gesture corresponding to selection is a tap.

Device 100 may also include one or more physical buttons, such as "home" or menu button 204. As described previously, menu button 204 may be used to navigate to any application 136 in a set of applications that may be executed on device 100. Alternatively, in some embodiments, the menu button is implemented as a soft key in a GUI displayed on touch screen 112.

In one embodiment, device 100 includes touch screen 112, menu button 204, push button 206 for powering the device on/off and locking the device, volume adjustment button(s) 208, subscriber identity module (SIM) card slot 210, headset jack 212, and docking/charging external port 124. Push button 206 is, optionally, used to turn the power on/off on the device by depressing the button and holding the button in the depressed state for a predefined time interval; to lock the device by depressing the button and releasing the button before the predefined time interval has elapsed; and/or to unlock the device or initiate an unlock process. In an alternative embodiment, device 100 also accepts verbal input for activation or deactivation of some functions through microphone 113. Device 100 also, optionally, includes one or more contact intensity sensors 165 for detecting intensity of contacts on touch screen 112 and/or one or more tactile output generators 167 for generating tactile outputs for a user of device 100.

FIG. 3 is a block diagram of an exemplary multifunction device with a display and a touch-sensitive surface in accordance with some embodiments. Device 300 need not be portable. In some embodiments, device 300 is a laptop computer, a desktop computer, a tablet computer, a multimedia player device, a navigation device, an educational device (such as a child's learning toy), a gaming system, or a control device (e.g., a home or industrial controller). Device 300 typically includes one or more processing units (CPUs) 310, one or more network or other communications interfaces 360, memory 370, and one or more communication buses 320 for interconnecting these components. Communication buses 320 optionally include circuitry (sometimes called a chipset) that interconnects and controls communications between system components. Device 300 includes input/output (I/O) interface 330 comprising display 340, which is typically a touch screen display. I/O interface 330 also optionally includes a keyboard and/or mouse (or other pointing device) 350 and touchpad 355, tactile output generator 357 for generating tactile outputs on device 300 (e.g., similar to tactile output generator(s) 167 described above with reference to FIG. 1A), sensors 359 (e.g., optical, acceleration, proximity, touch-sensitive, and/or contact intensity sensors similar to contact intensity sensor(s) 165 described above with reference to FIG. 1A). Memory 370 includes high-speed random access memory, such as DRAM, SRAM, DDR RAM, or other random access solid state memory devices; and optionally includes non-volatile memory, such as one or more magnetic disk storage devices, optical disk storage devices, flash memory devices, or other non-volatile solid state storage devices. Memory 370 optionally includes one or more storage devices remotely located from CPU(s) 310. In some embodiments, memory 370 stores programs, modules, and data structures analogous to the programs, modules, and data structures stored in memory 102 of portable multifunction device 100 (FIG. 1A), or a subset thereof. Furthermore, memory 370 optionally stores additional programs, modules, and data structures not present in memory 102 of portable multifunction device 100. For example, memory 370 of device 300 optionally stores drawing module 380, presentation module 382, word processing module 384, website creation module 386, disk authoring module 388, and/or spreadsheet module 390, while memory 102 of portable multifunction device 100 (FIG. 1A) optionally does not store these modules.

Each of the above-identified elements in FIG. 3 may be stored in one or more of the previously mentioned memory devices. Each of the above-identified modules corresponds to a set of instructions for performing a function described above. The above-identified modules or programs (e.g., sets of instructions) need not be implemented as separate software programs, procedures, or modules, and thus various subsets of these modules may be combined or otherwise rearranged in various embodiments. In some embodiments, memory 370 may store a subset of the modules and data structures identified above. Furthermore, memory 370 may store additional modules and data structures not described above.

Attention is now directed towards embodiments of user interfaces that may be implemented on, for example, portable multifunction device 100.

Figure 4A:
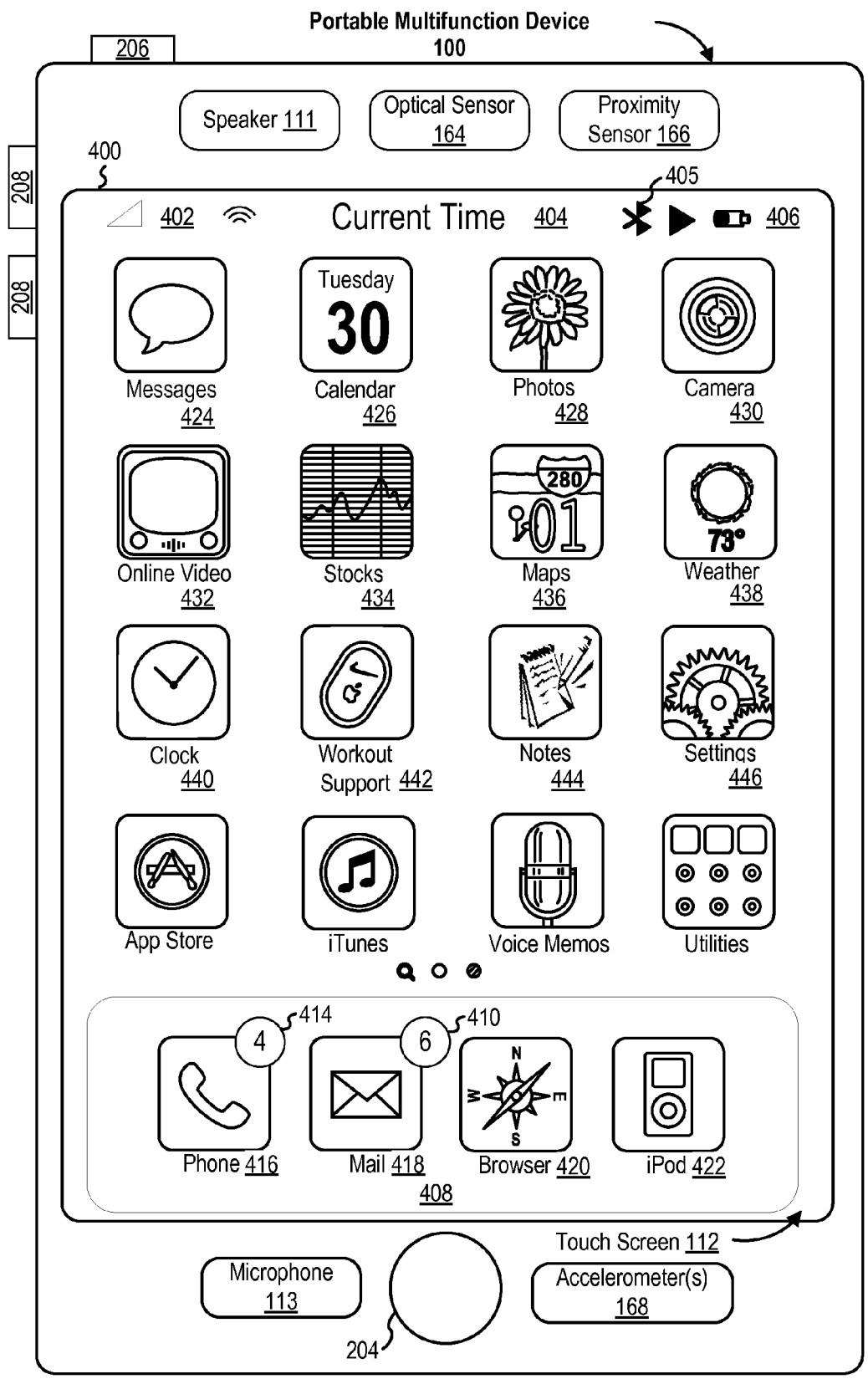
FIG. 4A illustrates an exemplary user interface for a menu of applications on a portable multifunction device in accordance with some embodiments.

FIG. 4A illustrates an exemplary user interface for a menu of applications on portable multifunction device 100 in accordance with some embodiments. Similar user interfaces may be implemented on device 300. In some embodiments, user interface 400 includes the following elements, or a subset or superset thereof:

Signal strength indicator(s) 402 for wireless communication(s), such as cellular and Wi-Fi signals;
Time 404;
Bluetooth indicator 405;
Battery status indicator 406;
Tray 408 with icons for frequently used applications, such as:
  Icon 416 for telephone module 138, labeled "Phone," which optionally includes an indicator 414 of the number of missed calls or voicemail messages;
  Icon 418 for e-mail client module 140, labeled "Mail," which optionally includes an indicator 410 of the number of unread e-mails;
  Icon 420 for browser module 147, labeled "Browser;" and
  Icon 422 for video and music player module 152, also referred to as iPod (trademark of Apple Inc.) module 152, labeled "iPod;" and
Icons for other applications, such as:
  Icon 424 for IM module 141, labeled "Messages;"
  Icon 426 for calendar module 148, labeled "Calendar;"
  Icon 428 for image management module 144, labeled "Photos;"
  Icon 430 for camera module 143, labeled "Camera;"
  Icon 432 for online video module 155, labeled "Online Video;"
  Icon 434 for stocks widget 149-2, labeled "Stocks;"
  Icon 436 for map module 154, labeled "Maps;"
  Icon 438 for weather widget 149-1, labeled "Weather;"
  Icon 440 for alarm clock widget 149-4, labeled "Clock;"
  Icon 442 for workout support module 142, labeled "Workout Support;"
  Icon 444 for notes module 153, labeled "Notes;" and
  Icon 446 for a settings application or module, labeled "Settings," which provides access to settings for device 100 and its various applications 136.

It should be noted that the icon labels illustrated in FIG. 4A are merely exemplary. For example, icon 422 for video and music player module 152 may optionally be labeled "Music" or "Music Player." Other labels are, optionally, used for various application icons. In some embodiments, a label for a respective application icon includes a name of an application corresponding to the respective application icon. In some embodiments, a label for a particular application icon is distinct from a name of an application corresponding to the particular application icon.

FIG. 4B illustrates an exemplary user interface on a device (e.g., device 300, FIG. 3) with a touch-sensitive surface 451 (e.g., a tablet or touchpad 355, FIG. 3) that is separate from the display 450 (e.g., touch screen display 112). Device 300 also, optionally, includes one or more contact intensity sensors (e.g., one or more of sensors 357) for detecting intensity of contacts on touch-sensitive surface 451 and/or one or more tactile output generators 359 for generating tactile outputs for a user of device 300.

Although some of the examples which follow will be given with reference to inputs on touch screen display 112 (where the touch-sensitive surface and the display are combined), in some embodiments, the device detects inputs on a touch-sensitive surface that is separate from the display, as shown in FIG. 4B. In some embodiments, the touch-sensitive surface (e.g., 451 in FIG. 4B) has a primary axis (e.g., 452 in FIG. 4B) that corresponds to a primary axis (e.g., 453 in FIG. 4B) on the display (e.g., 450). In accordance with these embodiments, the device detects contacts (e.g., 460 and 462 in FIG. 4B) with the touch-sensitive surface 451 at locations that correspond to respective locations on the display (e.g., in FIG. 4B, 460 corresponds to 468 and 462 corresponds to 470). In this way, user inputs (e.g., contacts 460 and 462, and movements thereof) detected by the device on the touch-sensitive surface (e.g., 451 in FIG. 4B) are used by the device to manipulate the user interface on the display (e.g., 450 in FIG. 4B) of the multifunction device when the touch-sensitive surface is separate from the display. It should be understood that similar methods are, optionally, used for other user interfaces described herein.

Additionally, while the following examples are given primarily with reference to finger inputs (e.g., finger contacts, finger tap gestures, finger swipe gestures), it should be understood that, in some embodiments, one or more of the finger inputs are replaced with input from another input device (e.g., a mouse-based input or stylus input). For example, a swipe gesture is, optionally, replaced with a mouse click (e.g., instead of a contact) followed by movement of the cursor along the path of the swipe (e.g., instead of movement of the contact). As another example, a tap gesture is, optionally, replaced with a mouse click while the cursor is located over the location of the tap gesture (e.g., instead of detection of the contact followed by ceasing to detect the contact). Similarly, when multiple user inputs are simultaneously detected, it should be understood that multiple computer mice are, optionally, used simultaneously, or a mouse and finger contacts are, optionally, used simultaneously.

As used here, the term "affordance" refers to a user-interactive graphical user interface object that may be displayed on the display screen of devices 100, 300, and/or 500 (FIGS. 1, 3, and 5). For example, an image (e.g., icon), a button, and text (e.g., hyperlink) may each constitute an affordance.

As used herein, the term "focus selector" refers to an input element that indicates a current part of a user interface with which a user is interacting. In some implementations that include a cursor or other location marker, the cursor acts as a "focus selector" so that when an input (e.g., a press input) is detected on a touch-sensitive surface (e.g., touchpad 355 in FIG. 3 or touch-sensitive surface 451 in FIG. 4B) while the cursor is over a particular user interface element (e.g., a button, window, slider or other user interface element), the particular user interface element is adjusted in accordance with the detected input. In some implementations that include a touch screen display (e.g., touch-sensitive display system 112 in FIG. 1A or touch screen 112 in FIG. 4A) that enables direct interaction with user interface elements on the touch screen display, a detected contact on the touch screen acts as a "focus selector" so that when an input (e.g., a press input by the contact) is detected on the touch screen display at a location of a particular user interface element (e.g., a button, window, slider, or other user interface element), the particular user interface element is adjusted in accordance with the detected input. In some implementations, focus is moved from one region of a user interface to another region of the user interface without corresponding movement of a cursor or movement of a contact on a touch screen display (e.g., by using a tab key or arrow keys to move focus from one button to another button); in these implementations, the focus selector moves in accordance with movement of focus between different regions of the user interface. Without regard to the specific form taken by the focus selector, the focus selector is generally the user interface element (or contact on a touch screen display) that is controlled by the user so as to communicate the user's intended interaction with the user interface (e.g., by indicating, to the device, the element of the user interface with which the user is intending to interact). For example, the location of a focus selector (e.g., a cursor, a contact, or a selection box) over a respective button while a press input is detected on the touch-sensitive surface (e.g., a touchpad or touch screen) will indicate that the user is intending to activate the respective button (as opposed to other user interface elements shown on a display of the device).

As used in the specification and claims, the term "characteristic intensity" of a contact refers to a characteristic of the contact based on one or more intensities of the contact. In some embodiments, the characteristic intensity is based on multiple intensity samples. The characteristic intensity is, optionally, based on a predefined number of intensity samples, or a set of intensity samples collected during a predetermined time period (e.g., 0.05, 0.1, 0.2, 0.5, 1, 2, 5, 10 seconds) relative to a predefined event (e.g., after detecting the contact, prior to detecting liftoff of the contact, before or after detecting a start of movement of the contact, prior to detecting an end of the contact, before or after detecting an increase in intensity of the contact, and/or before or after detecting a decrease in intensity of the contact). A characteristic intensity of a contact is, optionally based on one or more of: a maximum value of the intensities of the contact, a mean value of the intensities of the contact, an average value of the intensities of the contact, a top 10 percentile value of the intensities of the contact, a value at the half maximum of the intensities of the contact, a value at the 90 percent maximum of the intensities of the contact, or the like. In some embodiments, the duration of the contact is used in determining the characteristic intensity (e.g., when the characteristic intensity is an average of the intensity of the contact over time). In some embodiments, the characteristic intensity is compared to a set of one or more intensity thresholds to determine whether an operation has been performed by a user. For example, the set of one or more intensity thresholds may include a first intensity threshold and a second intensity threshold. In this example, a contact with a characteristic intensity that does not exceed the first threshold results in a first operation, a contact with a characteristic intensity that exceeds the first intensity threshold and does not exceed the second intensity threshold results in a second operation, and a contact with a characteristic intensity that exceeds the second threshold results in a third operation. In some embodiments, a comparison between the characteristic intensity and one or more thresholds is used to determine whether or not to perform one or more operations (e.g., whether to perform a respective operation or forgo performing the respective operation) rather than being used to determine whether to perform a first operation or a second operation.

In some embodiments, a portion of a gesture is identified for purposes of determining a characteristic intensity. For example, a touch-sensitive surface may receive a continuous swipe contact transitioning from a start location and reaching an end location, at which point the intensity of the contact increases. In this example, the characteristic intensity of the contact at the end location may be based on only a portion of the continuous swipe contact, and not the entire swipe contact (e.g., only the portion of the swipe contact at the end location). In some embodiments, a smoothing algorithm may be applied to the intensities of the swipe contact prior to determining the characteristic intensity of the contact. For example, the smoothing algorithm optionally includes one or more of: an unweighted sliding-average smoothing algorithm, a triangular smoothing algorithm, a median filter smoothing algorithm, and/or an exponential smoothing algorithm. In some circumstances, these smoothing algorithms eliminate narrow spikes or dips in the intensities of the swipe contact for purposes of determining a characteristic intensity.

The intensity of a contact on the touch-sensitive surface may be characterized relative to one or more intensity thresholds, such as a contact-detection intensity threshold, a light press intensity threshold, a deep press intensity threshold, and/or one or more other intensity thresholds. In some embodiments, the light press intensity threshold corresponds to an intensity at which the device will perform operations typically associated with clicking a button of a physical mouse or a trackpad. In some embodiments, the deep press intensity threshold corresponds to an intensity at which the device will perform operations that are different from operations typically associated with clicking a button of a physical mouse or a trackpad. In some embodiments, when a contact is detected with a characteristic intensity below the light press intensity threshold (e.g., and above a nominal contact-detection intensity threshold below which the contact is no longer detected), the device will move a focus selector in accordance with movement of the contact on the touch-sensitive surface without performing an operation associated with the light press intensity threshold or the deep press intensity threshold. Generally, unless otherwise stated, these intensity thresholds are consistent between different sets of user interface figures.

An increase of characteristic intensity of the contact from an intensity below the light press intensity threshold to an intensity between the light press intensity threshold and the deep press intensity threshold is sometimes referred to as a "light press" input. An increase of characteristic intensity of the contact from an intensity below the deep press intensity threshold to an intensity above the deep press intensity threshold is sometimes referred to as a "deep press" input. An increase of characteristic intensity of the contact from an intensity below the contact-detection intensity threshold to an intensity between the contact-detection intensity threshold and the light press intensity threshold is sometimes referred to as detecting the contact on the touch-surface. A decrease of characteristic intensity of the contact from an intensity above the contact-detection intensity threshold to an intensity below the contact-detection intensity threshold is sometimes referred to as detecting liftoff of the contact from the touch-surface. In some embodiments the contact-detection intensity threshold is zero. In some embodiments, the contact-detection intensity threshold is greater than zero.

In some embodiments described herein, one or more operations are performed in response to detecting a gesture that includes a respective press input or in response to detecting the respective press input performed with a respective contact (or a plurality of contacts), where the respective press input is detected based at least in part on detecting an increase in intensity of the contact (or plurality of contacts) above a press-input intensity threshold. In some embodiments, the respective operation is performed in response to detecting the increase in intensity of the respective contact above the press-input intensity threshold (e.g., a "down stroke" of the respective press input). In some embodiments, the press input includes an increase in intensity of the respective contact above the press-input intensity threshold and a subsequent decrease in intensity of the contact below the press-input intensity threshold, and the respective operation is performed in response to detecting the subsequent decrease in intensity of the respective contact below the press-input threshold (e.g., an "up stroke" of the respective press input).

In some embodiments, the device employs intensity hysteresis to avoid accidental inputs sometimes termed "jitter," where the device defines or selects a hysteresis intensity threshold with a predefined relationship to the press-input intensity threshold (e.g., the hysteresis intensity threshold is X intensity units lower than the press-input intensity threshold or the hysteresis intensity threshold is 75%, 90%, or some reasonable proportion of the press-input intensity threshold). Thus, in some embodiments, the press input includes an increase in intensity of the respective contact above the press-input intensity threshold and a subsequent decrease in intensity of the contact below the hysteresis intensity threshold that corresponds to the press-input intensity threshold, and the respective operation is performed in response to detecting the subsequent decrease in intensity of the respective contact below the hysteresis intensity threshold (e.g., an "up stroke" of the respective press input). Similarly, in some embodiments, the press input is detected only when the device detects an increase in intensity of the contact from an intensity at or below the hysteresis intensity threshold to an intensity at or above the press-input intensity threshold and, optionally, a subsequent decrease in intensity of the contact to an intensity at or below the hysteresis intensity, and the respective operation is performed in response to detecting the press input (e.g., the increase in intensity of the contact or the decrease in intensity of the contact, depending on the circumstances).

For ease of explanation, the descriptions of operations performed in response to a press input associated with a press-input intensity threshold or in response to a gesture including the press input are, optionally, triggered in response to detecting either: an increase in intensity of a contact above the press-input intensity threshold, an increase in intensity of a contact from an intensity below the hysteresis intensity threshold to an intensity above the press-input intensity threshold, a decrease in intensity of the contact below the press-input intensity threshold, and/or a decrease in intensity of the contact below the hysteresis intensity threshold corresponding to the press-input intensity threshold. Additionally, in examples where an operation is described as being performed in response to detecting a decrease in intensity of a contact below the press-input intensity threshold, the operation is, optionally, performed in response to detecting a decrease in intensity of the contact below a hysteresis intensity threshold corresponding to, and lower than, the press-input intensity threshold.

As used herein, an "installed application" refers to a software application that has been downloaded onto an electronic device (e.g., devices 100, 300, and/or 500) and is ready to be launched (e.g., become opened) on the device. In some embodiments, a downloaded application becomes an installed application by way of an installation program that extracts program portions from a downloaded package and integrates the extracted portions with the operating system of the computer system.

As used herein, the term "open application" or "executing application" refers to a software application with retained state information (e.g., as part of device/global internal state 157 and/or application internal state 192). An open or executing application may be any one of the following types of applications:

an active application, which is currently displayed on a display screen of the device that the application is being used on;

a background application (or background processes), which is not currently displayed, but one or more processes for the application are being processed by one or more processors; and a suspended or hibernated application, which is not running, but has state information that is stored in memory (volatile and non-volatile, respectively) and that can be used to resume execution of the application.

As used herein, the term "closed application" refers to software applications without retained state information (e.g., state information for closed applications is not stored in a memory of the device). Accordingly, closing an application includes stopping and/or removing application processes for the application and removing state information for the application from the memory of the device. Generally, opening a second application while in a first application does not close the first application. When the second application is displayed and the first application ceases to be displayed, the first application becomes a background application.

3. User Interfaces And Associated Processes

Attention is now directed towards embodiments of user interfaces ("UI") and associated processes that may be implemented on an electronic device with a display and a touch-sensitive surface, such as device 300 or portable multifunction device 100.

FIGS. 5A-5E illustrate exemplary user interfaces for representing and tracking battery usage of a device. The user interfaces in these figures are used to illustrate the processes described below, including the processes described below with reference to FIGS. 8-10.

Figure 5A:
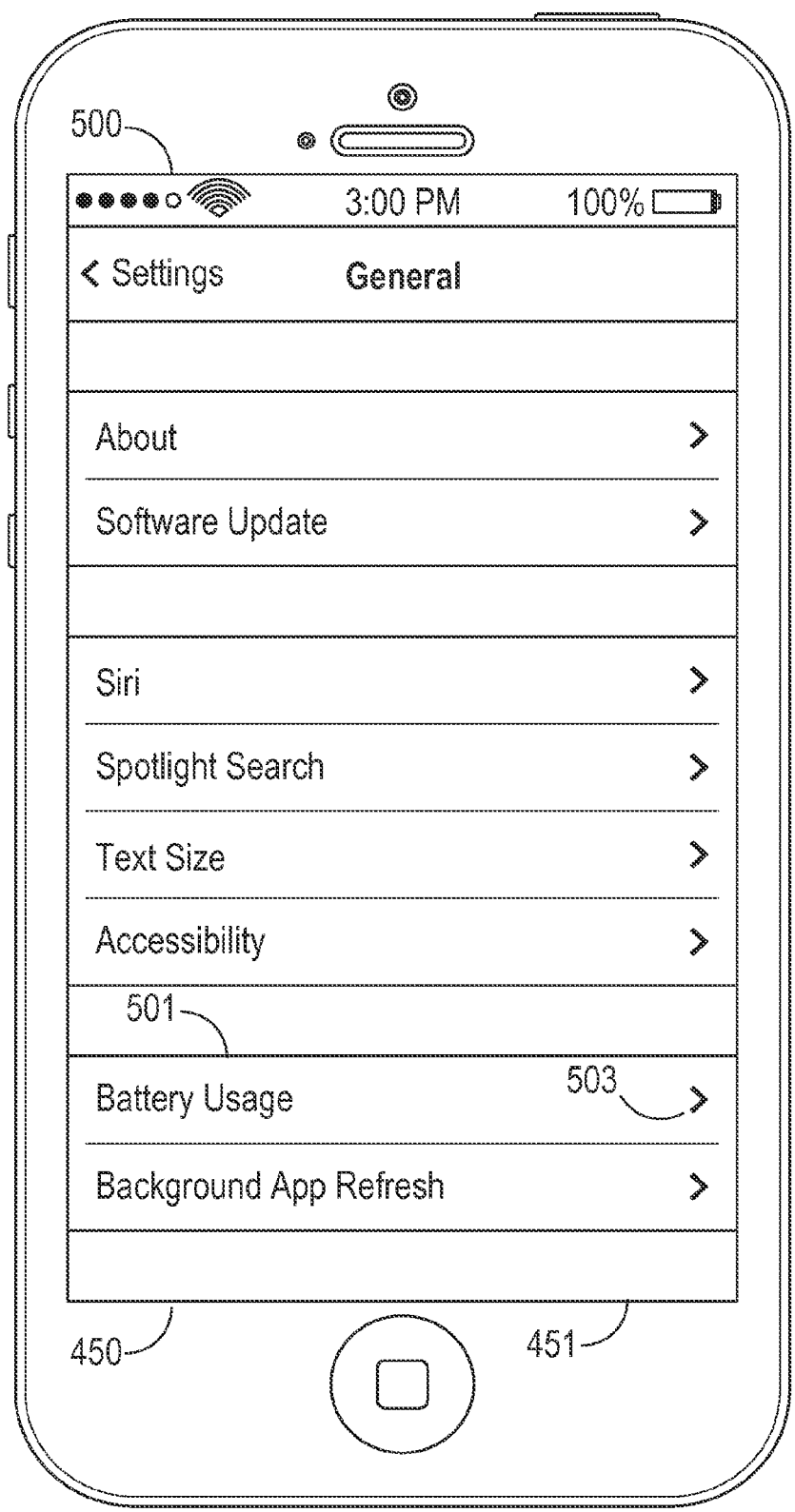
FIG. 5A illustrates an exemplary user interface for navigating to a battery usage user interface.

FIG. 5A illustrates an exemplary user interface for navigating to a battery usage user interface. User interface 500 can be displayed on a touch-sensitive display of a device (e.g., touch-sensitive display system 112 of device 100) and can responsive to gestures on a touch-sensitive surface. In some embodiments, the display and touch sensitive surface can be separate elements and in other embodiments, the display and touch sensitive surface can be a display with a touch sensitive surface (e.g., touch-sensitive display system 112 of device 100). User interface 500 can includes a general settings page with various user interface elements for accessing information about and settings for the device. For examples, as illustrated in FIG. 5A, user interface 500 includes user interface elements for information about the device ("About") and device software ("Software Update"). User interface 500 can also include user interface elements for information and settings about a voice assistant ("Siri"), search utility ("Spotlight Search"), text size of the device ("Text Size"), various accessibility features ("Accessibility"), and a background application refresh utility ("Background App Refresh"). The user interface 500 can also include a user interface element 501 for accessing battery usage of the device ("Battery Usage"). The user interface element 501 can include an indicator, such as arrow 503, to indicate to the user that activating the user interface element 501 causes navigation to another user interface. A gesture, such as a tap gesture, can be detected on touch sensitive surface 451 at user interface element 501 for battery usage of the device to navigate to the battery usage user interface.

Figure 5B:
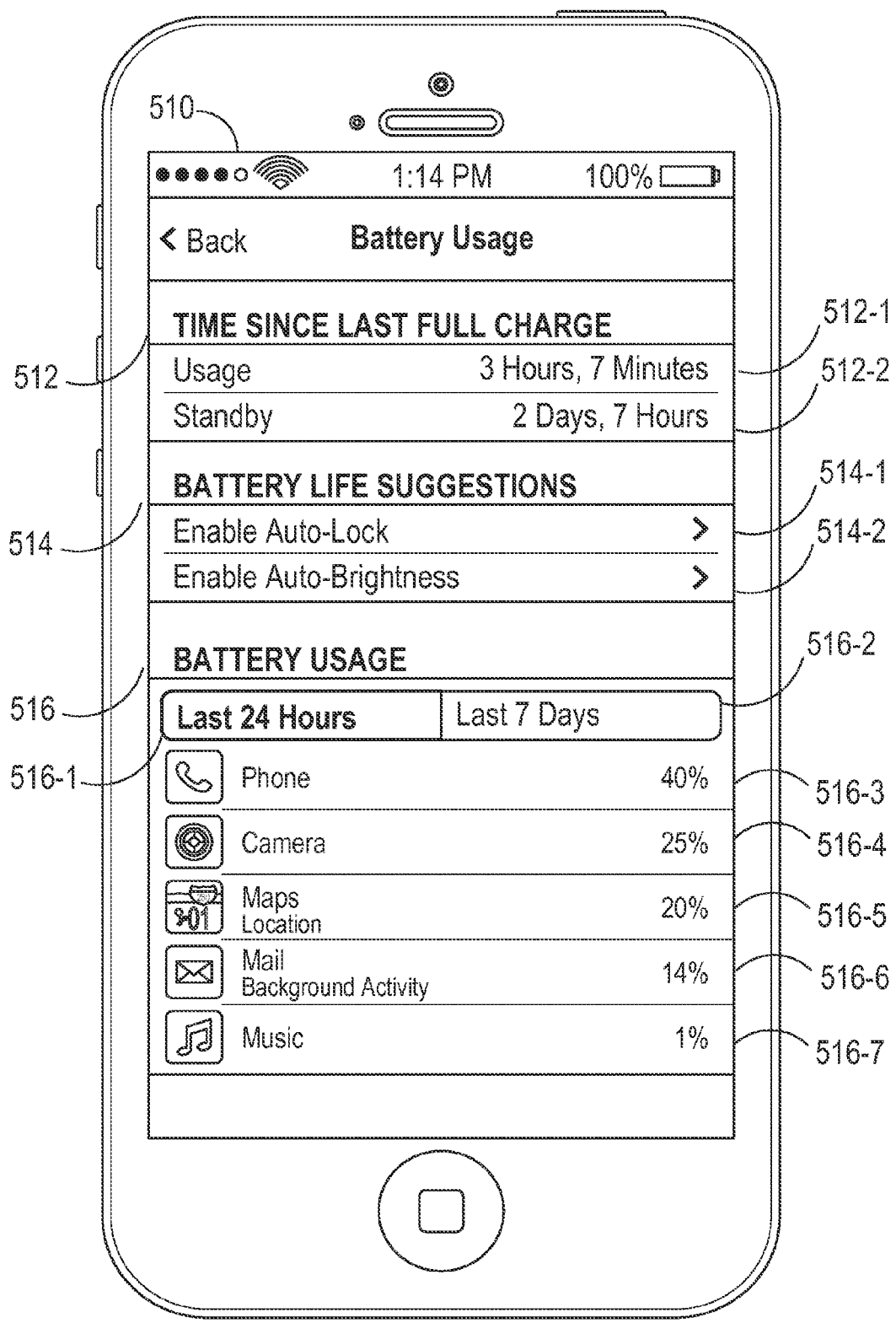
FIG. 5B illustrates an exemplary battery usage user interface.

FIG. 5B illustrates an exemplary battery usage user interface 510 that may be displayed in response to a gesture on interface element 501 of FIG. 5A. Battery usage user interface 510 includes a plurality of sections and a plurality of user interface elements, such as a section 512 corresponding to usage statistics since a last full charge ("TIME SINCE LAST FULL CHARGE"), a section 514 corresponding to suggestions to improve battery life ("BATTERY LIFE SUGGESTIONS"), and a section 516 corresponding to battery usage attributed to various items ("BATTERY USAGE"), such as various software applications. Section 512 includes a representation 512-1 of the amount of time the device has been awake and in use (e.g. making a call, using email, listening to music, browsing the web, sending and receiving text messages, or during certain background tasks such as auto-checking email, etc.) since the last full charge ("Usage") and a representation 512-2 of the amount of time the device has been powered on including the time the device has been asleep ("Standby").

Attention is now directed to section 516 of user interface 510, which provides information regarding battery usage attributed to various items, such as software applications. Section 516 includes user interface element 516-1 for selecting display of battery usage over a first time period ("Last 24 Hours," as shown) and a user interface element 516-2 for selecting display of batter usage over a second time period ("Last 7 Days," as shown). In some embodiments, battery usage is displayed for a time period that is based on a period of operation of the device, such as the last 24 hours of device operation or state (e.g., standby), even when those 24 operating hours span a calendar period of several days. In other embodiments, battery usage is displayed for a time period that is based on calendar days, irrespective of device operation or state.

In some embodiments, a selected time period (e.g., 24 hours) is designated as the default time period shown, when user interface 510 is generated in response to a request to display a battery usage user interface. In embodiments having a default time period designated for display, display of battery usage for a non-default time period (e.g., 7 days) may be requested by selecting a user interface element, such as element 516-2. In FIG. 5B, battery usage is currently shown for the last 24 hours, as indicated by the bolding of user interface element 516-1. In the exemplary interface of FIG. 5B, tracked battery usage is shown for five items as percentages of total usage: Phone application 516-3 (40%), Camera application 516-4 (25%), Maps application 516-5 (20%), Mail application 516-6 (14%), and Music application 516-7 (1%). As shown, the items are ordered by decreasing percentage of battery usage. In other embodiments, displayed items may be ordered or sorted according alternative orders such as alphabetical order, most recent usage, or the like. In FIG. 5B, battery usage for each item is shown as a percentage of the battery usage for the selected time interval (e.g., 24 hours), with 100% of the battery usage for the device attributable to the five items shown. In other embodiments, battery usage for an item may be shown in alternative formats such as a fraction of total usage, as an absolute value (e.g., amps or milliamps), or the like. The sum of the battery usage of the items shown may be less than 100% in other embodiments. Alternative embodiments of battery usage section 516 may display only items meeting certain criteria, such as items having usage that exceeds a certain threshold (e.g., greater than 1%). In some embodiments, additional items may be accessible by scrolling the screen, selecting a provided interface object, or not shown at all.

The device (e.g., device 100) may determine the battery usage value associated with each item according to a number of methods. In some embodiments, device 100 continuously or periodically monitors battery usage by one or more hardware subsystems/components or software subsystems/components, such as those shown in FIG. 3. For example, device 100 may monitor power drawn by display system 112 (e.g., from a display backlight), processor(s) 120 (e.g., a central processor or a graphics processor), a wireless antenna, a software extension associated with an active application, or a daemon (e.g., a notification daemon) running on device 100. In one embodiment, all battery usage occurring while an application (e.g., phone application 516-3) is active is attributed to that application. If a second application (e.g., camera application 516-4) becomes active on device 100, battery usage occurring during the period of activity of the second application is attributed to that application. In another embodiment, battery usage by a given subsystem (e.g., processor(s) 120) may be attributed to active and background applications according to a distributed model. For example, a percentage (e.g., 60%) of processor battery usage, resulting from execution of a first operating system process, may be attributed to an active application (e.g., phone application 516-3) while a second percentage (e.g., 40%) of processor battery usage is attributed to background processes/activity associated with another application (e.g., mail application 516-6). In some embodiments, battery usage associated with selected hardware or software subsystems is excluded from monitoring or excluded from the calculation of total battery usage. For example, battery usage associated with baseline, operating system functions may be excluded from the calculation of total battery usage such that calculated and/or displayed battery usage is only based on usage attributed to selected (e.g., discretionary) items, such as an active software application (e.g., phone application 516-3). In other embodiments, battery usage resulting from system processes and activities that primarily benefit an application (e.g., mail application 516-6) are attributed to the application, even if the application is not the active application when battery usage occurs. For example, battery usage resulting from pulling mail messages may include waking up a wireless antenna and connecting to a mail server is attributed to the mail application even if the mail application was not active/open during the battery usage. In some embodiments battery usage caused by background activity for the benefit of the second application is similarly attributed to the second application.

By monitoring, attributing, and displaying battery usage according to designated items, particular software applications, device 100 provides the information in a more salient format, more closely linked to particular function and uses of the device. Users can more readily connect the information to their use of the device and its functions and, should they desire, adjust their use to conserve battery life.

In some embodiments, device 100 monitors and logs battery usage, but does not calculate and/or attribute battery usage values until a request for display of a battery usage interface (e.g., interface 510) is received by device 100. In other embodiments, battery usage values are calculated on a continuous or periodic basis, independent of requests for display of a battery usage interface (e.g., interface 510). In some embodiments, such as the embodiment of FIG. 5B, battery usage information is specifically not attributed and displayed directly to hardware subsystems. In such embodiments, items associated with battery usage may be limited to software applications and all monitored batter usage from hardware subsystems is attributed to, and distributed between, to those software applications.

Battery usage attributed to one or more items may be displayed with qualifier information. As seen in FIG. 5B, battery usage attributed to maps application 516-5 is displayed with the qualifier "Location." Similarly, battery usage attributed to Mail application 516-6 is displayed with qualifier "Background Activity." Through the use of qualifiers, device 100 may provide the user with additional information to signal exceptional, atypical, or notable battery usage scenarios that may be relevant to the user's use patterns for an application or impact battery life for the device. Device 100 may display one or more qualifiers with battery usage information for an item based on a determination that qualifier display criteria are met and not display such qualifiers when the criteria are not met. Qualifier criteria may include, but is not limited to, criteria relating to comparative battery usage statistics, both within the set of battery usage statistics attributable to a particular item (e.g., software application) and to the device as a whole. For example, criteria may include a percentage of battery usage attributable to a particular item from a particular subsystem (e.g., wireless antenna) exceeding a minimum threshold (e.g., 30%) of total battery usage of the device or attributable to the particular item alone. With reference to the qualifier "Location" displayed with maps application 516-5, the criteria may be battery usage associated with one or more location-affiliated hardware subsystems attributable to the map application exceeding 30% of total battery usage associated with the maps application and also exceeding 1% of total battery usage across the device for the relevant time period. Similarly, qualifier "background activity" may be displayed with mail application 516-6 when software and hardware subsystems attributable to the mail application, while running in a background state, exceed 30% of total battery usage associated with the mail application and also exceeds at 1% of total battery usage across the device for the relevant time period. Other qualifier criteria may include, but is not limited to, application status (e.g., background or foreground/active), discretionary settings (e.g., high brightness), network/environmental factors such as poor network or cellular signal causing higher-than-usual battery usage from antennas, specific application extensions such as AirPlay and AirDrop extensions provided by Apple Inc., time of usage (e.g., time of day or minutes of consecutive usage). Note that, depending on the qualifier criteria and the pattern of battery usage, a qualifier may be displayed when usage is displayed according to a first time period (e.g., "Last 24 Hours"), but not displayed when a second time period is displayed (e.g., "Last 7 Days"). Accordingly, in some embodiments, even though a qualifier is displayed for the first time period, the qualifier is not necessarily also displayed for a second time period if the exceptional battery usage during the second period does not meet the qualifier display criteria. In some embodiments, the qualifier display criteria are set at a level that generally results in a minimal use of qualifiers in the battery usage interface so as to draw the user's attention to exceptional use that might be surprising to the user without cluttering the user interface with qualifiers that the user is not concerned with. This may achieved, for example, by setting a maximum number of qualifiers that can be displayed in conjunction with the use of additional criteria (e.g., total battery usage) for selecting qualifiers for display when the maximum number of criteria is exceeded. In some embodiments, multiple qualifiers may be displayed for a single item. In one embodiment where multiple qualifiers are identified for display, device 100 provides a single, aggregate qualifier based on the multiple identified qualifiers. For example, device 100 may determine that the separate qualifiers "Background Activity" and "Location" are applicable to the battery usage attributed to a software application and then aggregate the two qualifiers to display "Background Location." In another embodiment, one or more elements of multiple qualifiers may be truncated. For example, device 100 may determine that the separate qualifiers "poor cellular signal" and "audio" are applicable to the battery usage attributed to a software application and then truncate the first qualifier to display "poor cellular, audio," thereby reducing screen clutter. In another embodiment, device 100 may have logic governing or suppressing the display of multiple qualifiers, based on relationships between the qualifiers. Device 100 may determine that the separate qualifiers "location" and "antenna" are applicable to the battery usage attributed to a software application and then truncate the "antenna" qualifier to display just "location," because a user would understand that "location" services make extensive use of antennas.

Figure 5C:
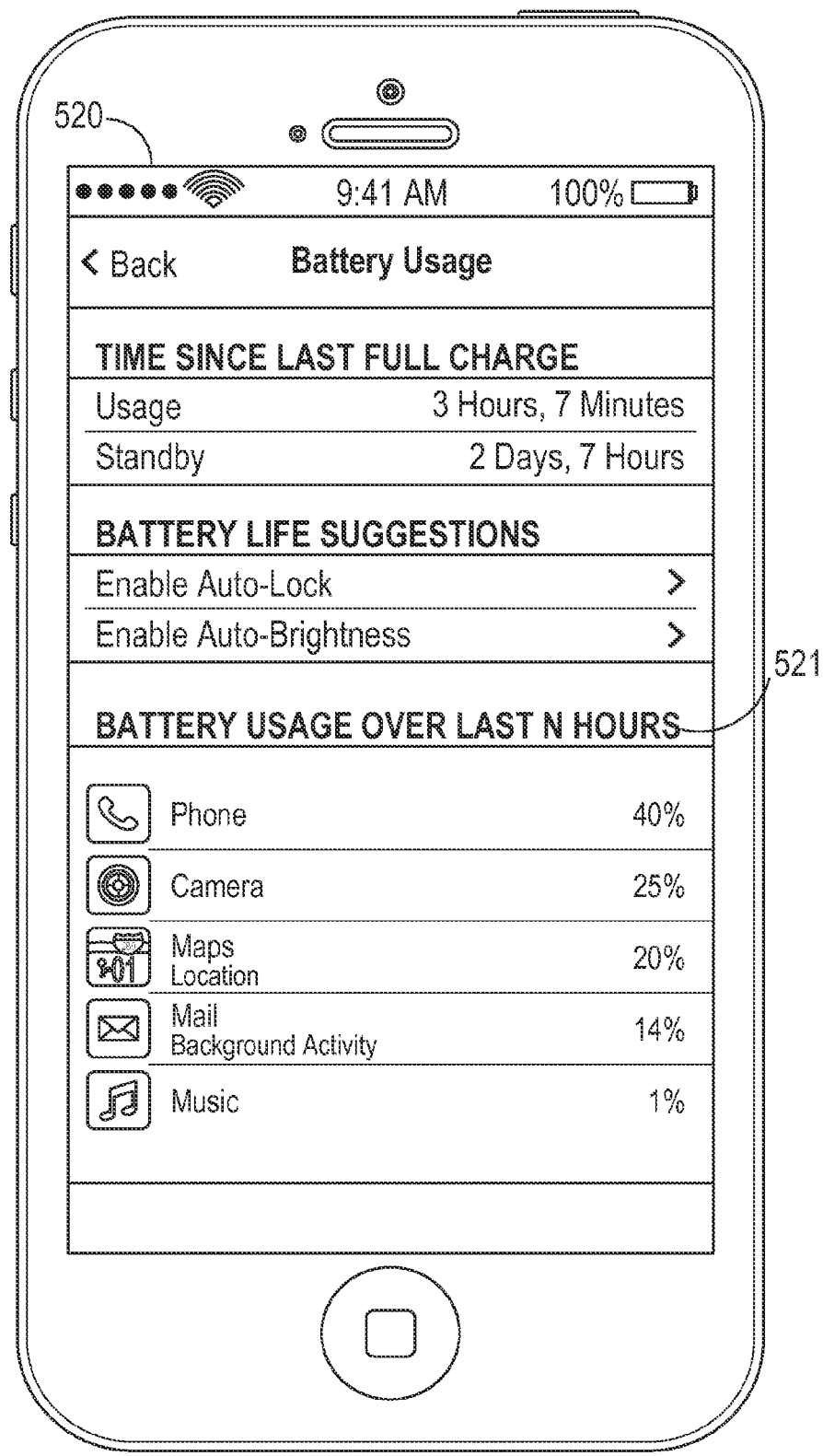
FIG. 5C illustrates an exemplary battery usage user interface for displaying battery usage over a period of time of device operation.

FIG. 5C illustrates another exemplary battery usage user interface 520 that may be displayed in response to a gesture on interface element 501 of FIG. 5A. Section 521 of user interface 520 provides information regarding battery usage attributed to various items. In the embodiment of FIG. 5C, battery usage defaults to display for usage over a time period that is based on the period of operation of the device. The embodiment of FIG. 5C may be particularly useful, for example, during a period of initial operation of a device (e.g., a newly activated device). As operation of the device continues and exceeds certain time thresholds, the battery usage user interface may display interface options for additional time periods (or default to alternative time periods), as seen in FIG. 5B.

Figure 5D:
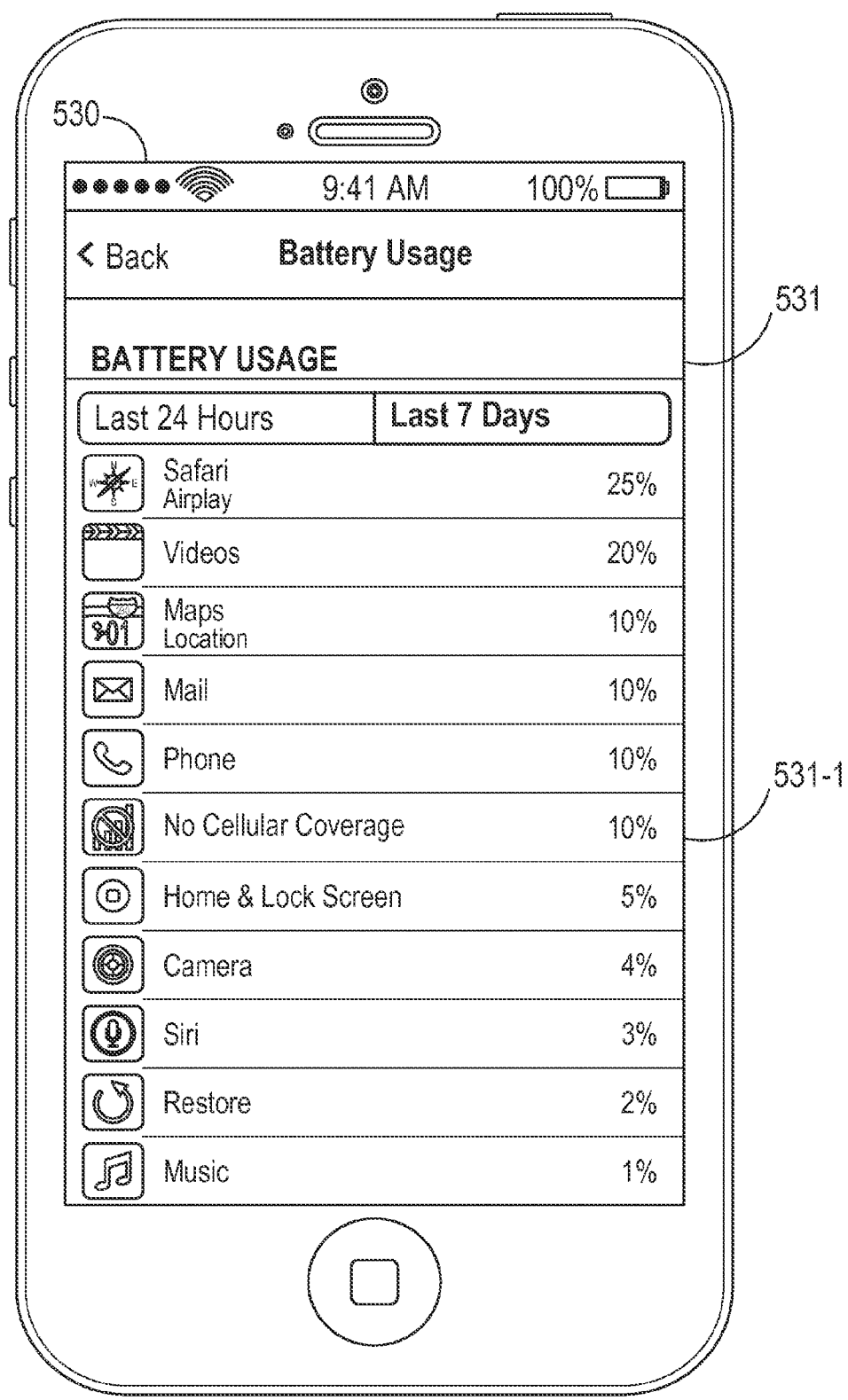
FIG. 5D illustrates yet another exemplary battery usage user interface.

FIG. 5D illustrates yet another exemplary battery usage user interface 530. Interface 530 is primarily dedicated to section 531, provides information regarding battery usage attributed to various items. In some embodiments, user interface 530 may be displayed directly in response to a gesture on interface element 501 of FIG. 5A. In other embodiments, user interface 530 is displayed in response to a request to display an expanded section 531, starting from an interface having a smaller section for providing information regarding battery usage attributed to various items. As seen in FIG. 5D, battery usage resulting from a hardware or software subsystem common to several applications may aggregated and then attributed as a separate item, while not attributing that battery usage to the several applications. For example, a battery usage interface (e.g., interfaces 510, 520, or 530) may include a separate item 532-1, and associated battery usage, for "no cellular signal," (i.e., battery usage primarily resulting from a high level of cellular antennae activity due to the absence of a cellular reception) without attributing that battery usage, in whole or in part, to several applications that commonly require cellular signal. Similarly, battery usage from a software subsystem (e.g., a software personal assistant subsystem or one or more software subsystems associated with a home screen, a lock screen, or a notification screen) that may be commonly used by several applications may be included as a separate item, with associated battery usage, in a battery usage interface, without attributing battery usage from the software subsystem, in whole or in part, to several applications that commonly use the software subsystem.

Figure 5E:
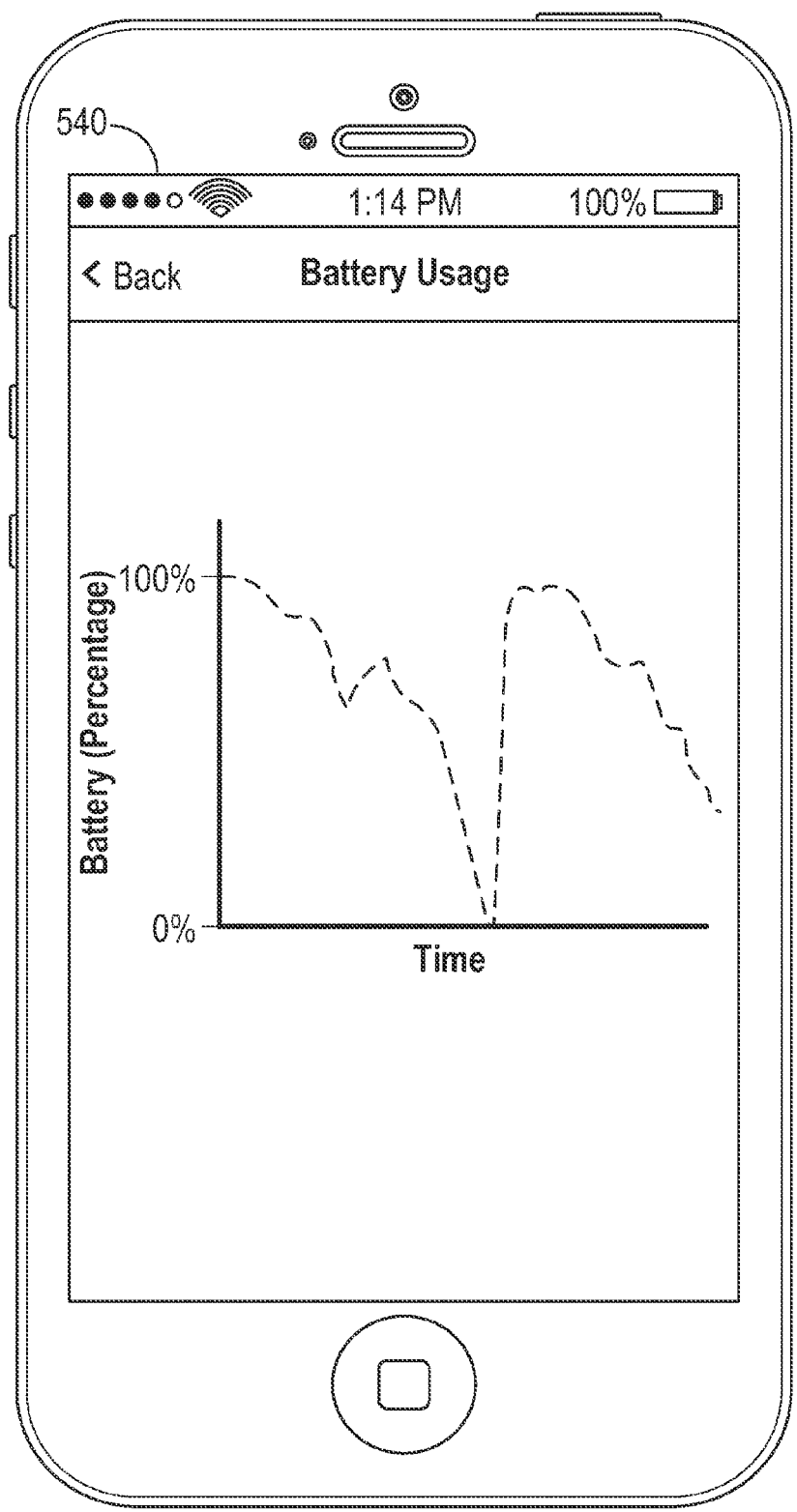
FIG. 5E illustrates a battery usage histogram user interface.

FIG. 5E illustrates a battery usage histogram user interface 540 that may be displayed directly in response to a gesture on interface element 501 of FIG. 5A or in response to a request received while displaying any of interfaces 5B to 5D. User interface 540 displays changes in battery percentage (e.g., usage and charging) as a function of time.

Attention is now directed back to FIG. 5B, and to section 514 of user interface 510, in particular. Section 514 provides recommendations of actions (e.g., enabling options such as auto-lock or auto-brightness) or settings that may be used to improve battery life. In some embodiments, section 514 or particular suggestions of section 514 are displayed only in response to a determination that battery savings suggestion criteria have been met and are not displayed when such criteria are not met. For example, a suggestion to enable auto-lock (514-1) may only be displayed if device 100 determines, based on historical battery usage, that enabling auto-lock would improve battery usage, with or without a minimum improvement threshold value (e.g., at 1%, 2%, or 5%). Similarly, a suggestion to enable auto-brightness (514-2) may only be displayed if device 100 determine, based on historical battery usage, that enabling auto-brightness would improve battery usage. Upon receiving an input on a battery savings suggestion, device 100 may provide the user with an interface for adopting the battery savings suggestion. In other embodiments, battery savings suggestions may include suggestions to enable or disable wireless connectivity or a cellular protocol (e.g., LTE), and configure application parameters (e.g., mail fetch parameters). In one embodiment, device 100 monitors and logs or records one or more device operational parameters to determine whether a battery savings suggestion criteria would be met. For example, device 100 may log or record ambient light values to determine if enabling auto-brightness would result in a predicted improvement in battery usage.

Figure 6:
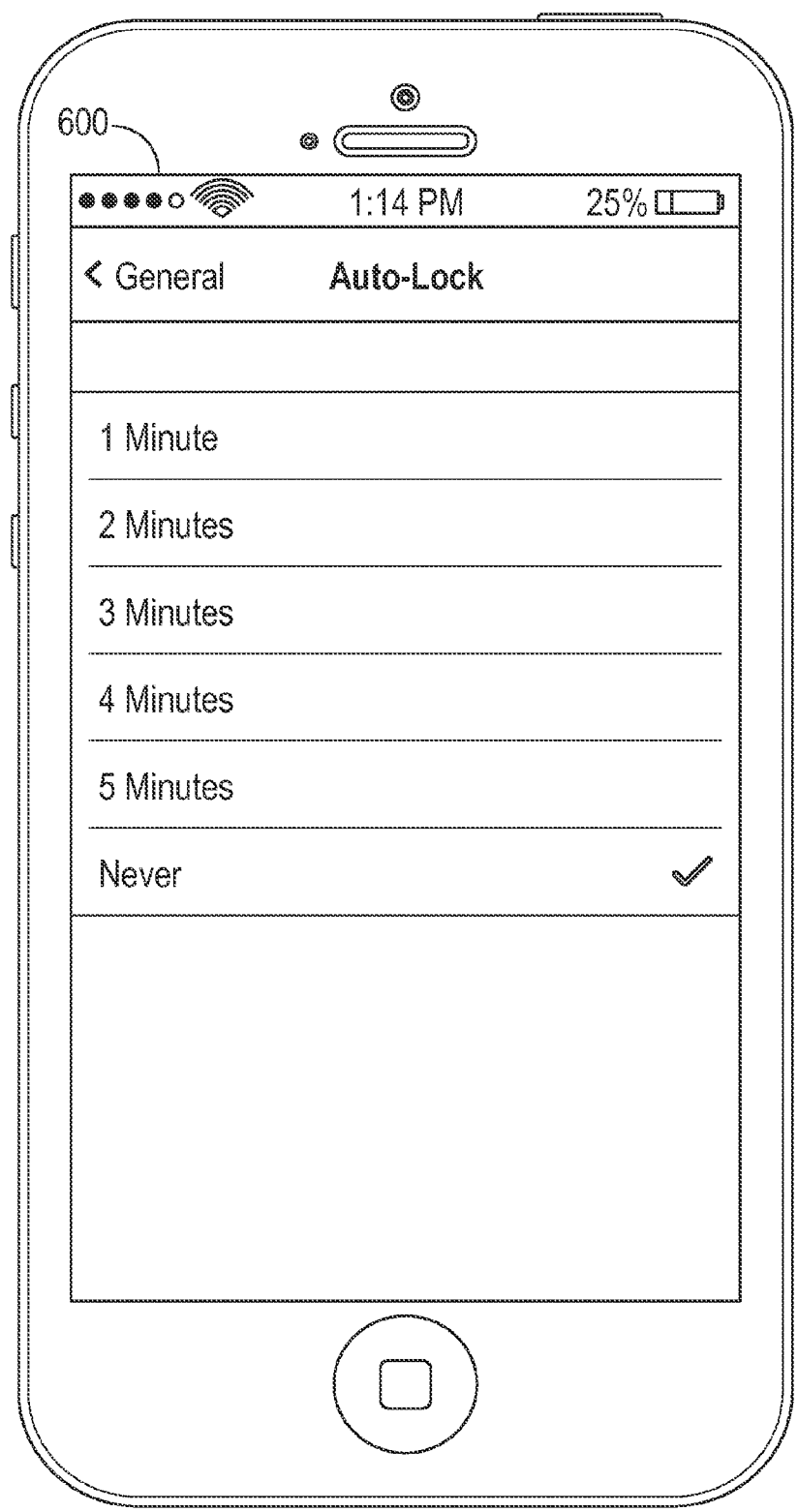
FIG. 6 illustrates an exemplary user interface for adopting an enable auto-lock battery savings suggestion on a device.
Figure 7:
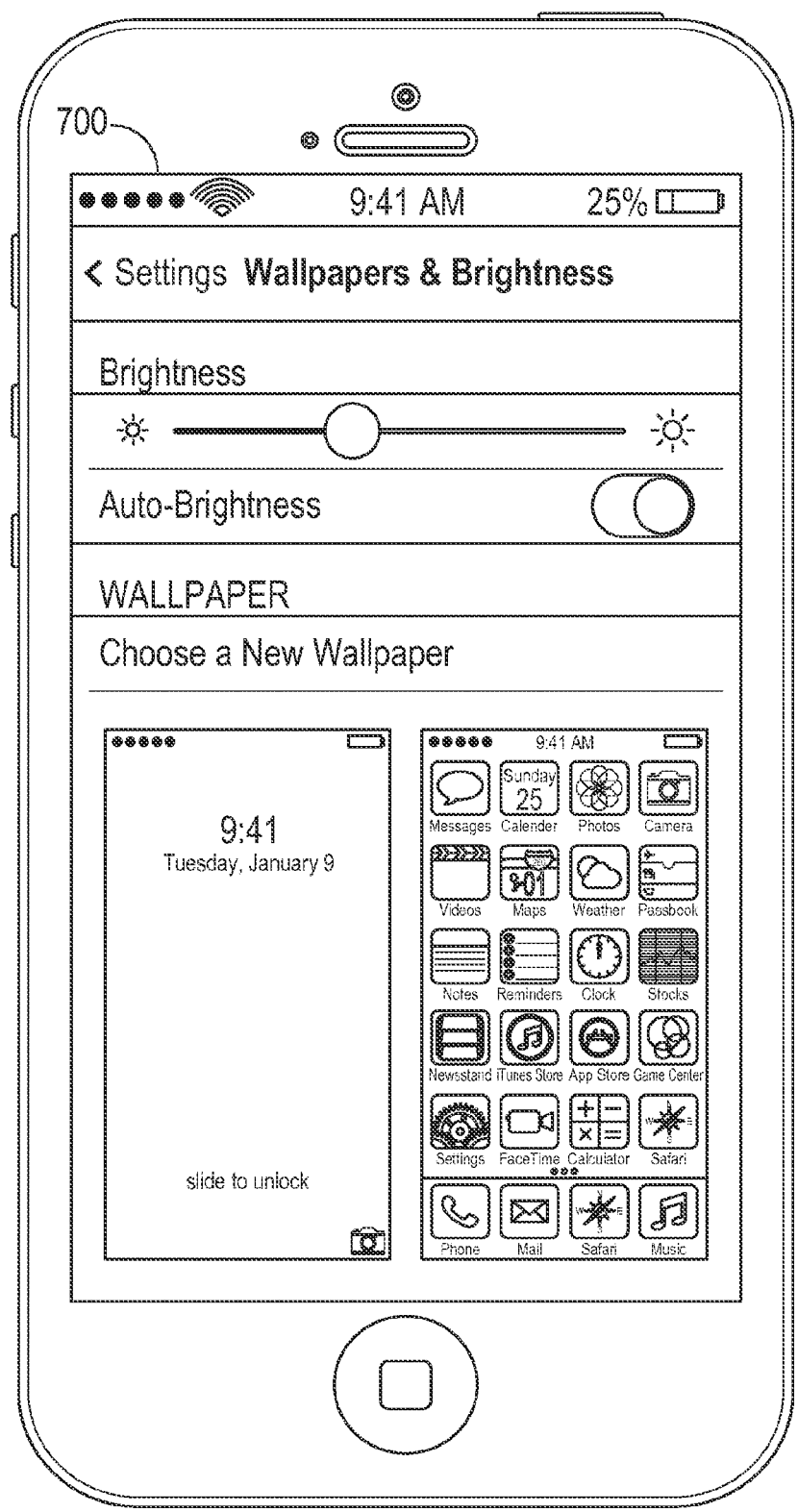
FIG. 7 illustrates an exemplary user interface for adopting an enable auto-brightness battery savings suggestion on a device.

FIG. 6 illustrates an exemplary user interface 600 for adopting an enable auto-lock battery savings suggestion on device 100. In some embodiments, the user interface of FIG. 6 is a user interface also accessible from a settings option or application of device 100. In other embodiments, the user interface of FIG. 6 is specially provided in response to a request made from a battery usage interface. Similarly, FIG. 7 illustrates an exemplary user interface 700 for adopting an enable auto-brightness battery savings suggestion on device 100.

FIG. 8 is a flow diagram illustrating process 800 for tracking battery usage. Process 800 may be performed at an electronic device with one or more processors and memory, like device 100 (FIGS. 1A-1B) and device 300 (FIG. 3). At block 802, the device attributes a portion of battery usage of a first hardware subsystem to a first application based on the battery usage of the first hardware subsystem that occurred during activity by the first application. At block 804, the device attributes a portion of the battery usage of the first hardware subsystem to a second application based on the battery usage of the first hardware subsystem that occurred during activity by the second application. Optionally, at block 804, the device may attribute a portion of battery usage of a second hardware subsystem to the first application based on the battery usage of the second hardware subsystem that occurred during activity by the first application and attribute a portion of the battery usage of the second hardware subsystem to the second application based on the battery usage of the second hardware subsystem that occurred during activity by the second application. Optionally, at block 804, the device may attribute a portion of battery usage of a first software subsystem to the first application based on the battery usage of the first software subsystem that occurred during activity by the first application and attribute a portion of the battery usage of the first software subsystem to the second application based on the battery usage of the first software subsystem that occurred during activity by the second application. At block 806, the device receives a request (e.g., request received in interface of FIG. 5A) to display a battery usage user interface. At block 808, in response to the request, the device displays the battery usage user interface (e.g., FIG. 5A-5E) that includes a representation of the battery usage attributed to the first application and a representation of the battery usage attributed the second application.

Note that details of the processes described above with respect to process 800 (e.g., FIG. 8) are also applicable in an analogous manner to the processes described below. For example, processes 900 and 1000 may include one or more of the characteristics of the various processes described above with reference to process 800. For brevity, these details are not repeated above. The various methods and techniques described above with reference to process 800 may be optionally implemented as one or more units, such as those described with regard to FIG. 11.

The operations described above with reference to the figures may be implemented by components depicted in FIGS. 1A-1B. For example, attribution operations, request operations, and display operations may be implemented by event sorter 170, event recognizer 180, and event handler 190. Event monitor 171 in event sorter 170 detects a contact on touch-sensitive display 112, and event dispatcher module 174 delivers the event information to application 136-1. A respective event recognizer 180 of application 136-1 compares the event information to respective event definitions 186, and determines whether a first contact at a first location on the touch-sensitive surface corresponds to a predefined event or sub-event, such as selection of an object on a user interface. When a respective predefined event or sub-event is detected, event recognizer 180 activates an event handler 190 associated with the detection of the event or sub-event. Event handler 190 may utilize or call data updater 176 or object updater 177 to update the application internal state 192. In some embodiments, event handler 190 accesses a respective GUI updater 178 to update what is displayed by the application. Similarly, it would be clear to a person having ordinary skill in the art how other processes can be implemented based on the components depicted in FIGS. 1A-1B.

FIG. 9 is a flow diagram illustrating method 900 for tracking battery usage. Method 900 may be performed at an electronic device with one or more processors and memory, like device 100 (FIGS. 1A-1B) and device 300 (FIG. 3). At block 902, the device determines battery usage attributed to a first application over a first time period. The battery usage attributed to the first application over the first time period includes exceptional battery usage that occurred during the first time period. At block 904, the device receives a request to display a battery usage user interface (e.g., request received in interface of FIG. 5A). At block 906, in response to receiving the request, and in accordance with a determination that the exceptional battery usage attributed to the first application that occurred during the first time period meets qualifier display criteria, the device displays a representation of battery usage (e.g., FIG. 5A-5E) attributed to the first application over the first time period that includes qualifier information that is indicative of one or more causes of the exceptional battery usage attributed to the first application over the first time period. At block 908, in response to receiving the request, and in accordance with a determination that the exceptional battery usage attributed to the first application that occurred during the first time period does not meet the qualifier display criteria, displaying a representation of battery usage (e.g., FIG. 5A-5E, without qualifiers) attributed to the first application over the first time period that does not include the qualifier information.

Note that details of the processes described above with respect to process 900 (e.g., FIG. 9) are also applicable in an analogous manner to the processes described below. For example, processes 800 and 1000 may include one or more of the characteristics of the various processes described above with reference to process 900. For brevity, these details are not repeated above. The various methods and techniques described above with reference to process 900 may be optionally implemented as one or more units, such as those described with regard to FIG. 11.

The operations described above with reference to the figures may be implemented by components depicted in FIGS. 1A-1B. For example, determination operations, request operations, and display operations may be implemented by event sorter 170, event recognizer 180, and event handler 190. Event monitor 171 in event sorter 170 detects a contact on touch-sensitive display 112, and event dispatcher module 174 delivers the event information to application 136-1. A respective event recognizer 180 of application 136-1 compares the event information to respective event definitions 186, and determines whether a first contact at a first location on the touch-sensitive surface corresponds to a predefined event or sub-event, such as selection of an object on a user interface. When a respective predefined event or sub-event is detected, event recognizer 180 activates an event handler 190 associated with the detection of the event or sub-event. Event handler 190 may utilize or call data updater 176 or object updater 177 to update the application internal state 192. In some embodiments, event handler 190 accesses a respective GUI updater 178 to update what is displayed by the application. Similarly, it would be clear to a person having ordinary skill in the art how other processes can be implemented based on the components depicted in FIGS. 1A-1B.

Figure 10:
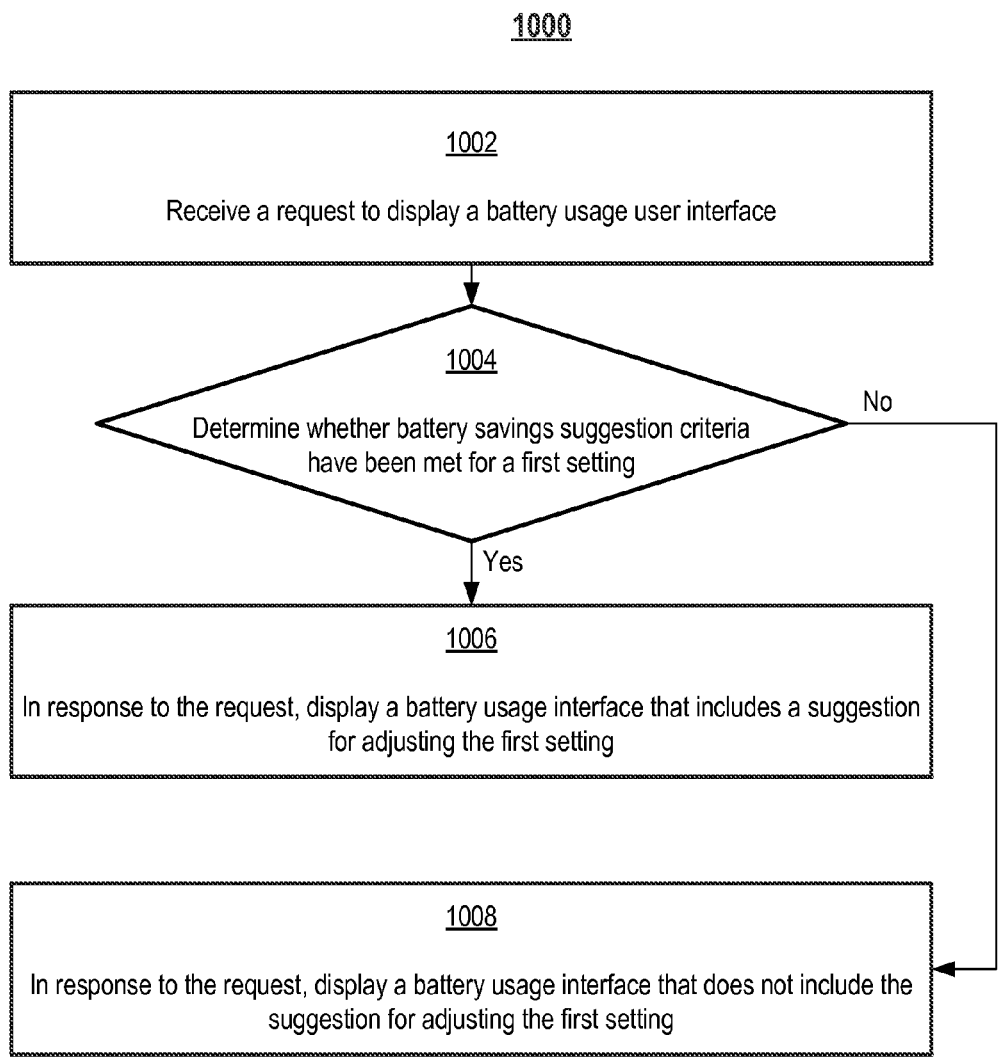
FIG. 10 is a flow diagram illustrating a method for tracking battery usage.

FIG. 10 is a flow diagram illustrating process 1000 for tracking battery usage. Process 1000 may be performed at an electronic device with one or more processors and memory, like device 100 (FIGS. 1A-1B) and device 300 (FIG. 3). At block 1002, the device receives a request to display a battery usage user interface (e.g., request received in interface of FIG. 5A). At block 1004, the device determines whether battery savings suggestion criteria have been met for a first setting. At block 1006, in response to the request, and in accordance with a determination that the battery savings suggestion criteria have been met for the first setting, the device displays a battery usage interface that includes a suggestion for adjusting the first setting (e.g., FIGS. 5A-5C). At block 1008, in response to the request, and in accordance with a determination that the battery savings suggestion criteria have not been met for the first setting, the device displays a battery usage interface (e.g., FIG. 5D) that does not include the suggestion for adjusting the first setting.

Note that details of the processes described above with respect to process 1000 (e.g., FIG. 10) are also applicable in an analogous manner to the processes described below. For example, processes 800 and 900 may include one or more of the characteristics of the various processes described above with reference to process 1000. For brevity, these details are not repeated above. The various methods and techniques described above with reference to process 1000 may be optionally implemented as one or more units, such as those described with regard to FIG. 11.

The operations described above with reference to the figures may be implemented by components depicted in FIGS. 1A-1B. For example, request operations, determination operations, and display operations may be implemented by event sorter 170, event recognizer 180, and event handler 190. Event monitor 171 in event sorter 170 detects a contact on touch-sensitive display 112, and event dispatcher module 174 delivers the event information to application 136-1. A respective event recognizer 180 of application 136-1 compares the event information to respective event definitions 186, and determines whether a first contact at a first location on the touch-sensitive surface corresponds to a predefined event or sub-event, such as selection of an object on a user interface. When a respective predefined event or sub-event is detected, event recognizer 180 activates an event handler 190 associated with the detection of the event or sub-event. Event handler 190 may utilize or call data updater 176 or object updater 177 to update the application internal state 192. In some embodiments, event handler 190 accesses a respective GUI updater 178 to update what is displayed by the application. Similarly, it would be clear to a person having ordinary skill in the art how other processes can be implemented based on the components depicted in FIGS. 1A-1B.

Figure 11:
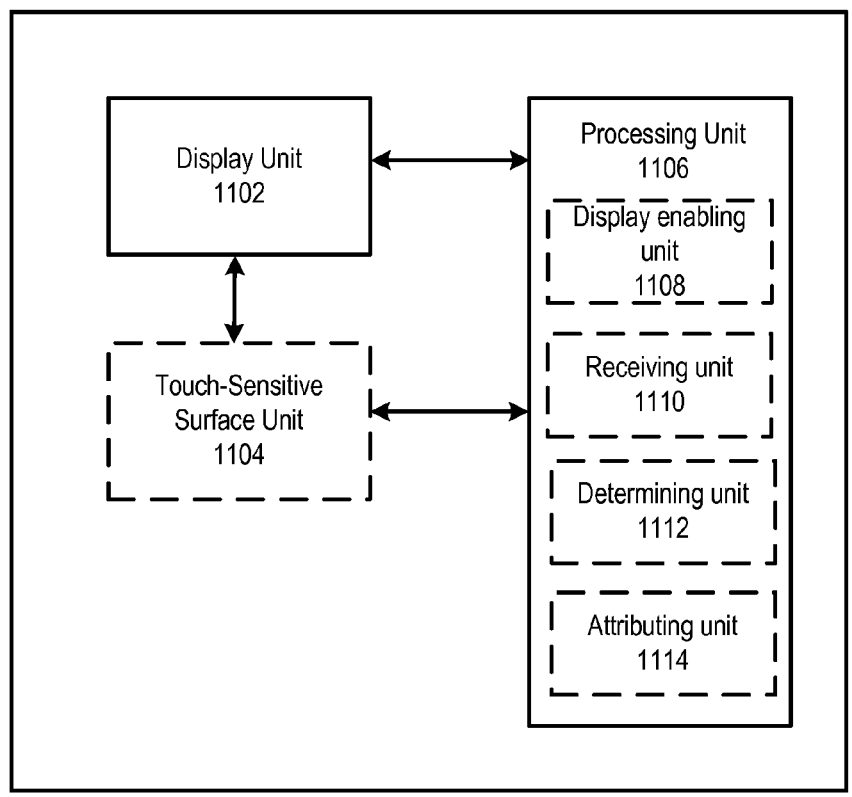
FIG. 11 illustrates a functional block diagram of an electronic device in accordance with some embodiments.

As shown in FIG. 11, an electronic device 1100 includes a display unit 1102 configured to display a user interface, an optional touch-sensitive surface unit 1104 configured to receive user contacts; and a processing unit 1106 coupled to the display unit 1102 and the touch-sensitive surface unit 1104. In some embodiments, the processing unit 1106 includes a display enabling unit 1108, a receiving unit 1110, a determining unit 1112, and an attributing unit 1114. The units of FIG. 11 may be used to implement the various techniques and methods described above with respect to FIGS. 5-10.

In some embodiments, the display enabling unit 1108 is configured to cause a display of a user interface (or portions of a user interface) in conjunction with the display unit 1102. For example, the display enabling unit 1108 may be used for: displaying the battery usage user interface that includes a representation of the battery usage attributed to the first application and a representation of the battery usage attributed the second application; displaying a representation of battery usage attributed to the first application over the first time period that includes qualifier information that is indicative of one or more causes of the exceptional battery usage attributed to the first application over the first time period; displaying a representation of battery usage attributed to the first application over the first time period that does not include the qualifier information; displaying a battery usage interface that includes a suggestion for adjusting the first setting; and displaying a battery usage interface that does not include the suggestion for adjusting the first setting.

In some embodiments, the receiving unit 1110 is configured to receive input. The input may be received, for example, through the use of the touch-sensitive surface unit 1104. In some embodiments, the input may be received, for example, through the use of the input/output (I/O) interface 330 shown in FIG. 3. For example, the receiving unit 1110 may be used for: receiving a request to display a battery usage user interface.

In some embodiments, the determining unit 1112 is configured to make determinations. For example, the determining unit 1112 may be used for: determining battery usage attributed to a first application over a first time period, wherein the battery usage attributed to the first application over the first time period includes exceptional battery usage that occurred during the first time period; and determining whether battery savings suggestion criteria have been met for a first setting.

In some embodiments, the attributing unit 1114 is configured to attribute information. For example, the attributing unit 1114 may be used for: attributing a portion of battery usage of a first hardware subsystem to a first application based on the battery usage of the first hardware subsystem that occurred during activity by the first application; and attributing a portion of the battery usage of the first hardware subsystem to a second application based on the battery usage of the first hardware subsystem that occurred during activity by the second application.

What is claimed is:

1. A non-transitory computer-readable storage medium storing one or more programs, the one or more programs comprising instructions, which when executed by an electronic device with one or more processors and memory, cause the device to:
    attribute a portion of battery usage of a first hardware subsystem during a first time period to a first application based on the battery usage of the first hardware subsystem that occurred during activity by the first application during the first time period;
    attribute a portion of the battery usage of the first hardware subsystem during the first time period to a second application based on the battery usage of the first hardware subsystem that occurred during activity by the second application during the first time period;
    receive a request to display a battery usage user interface corresponding to the first time period;
    in response to the request to display a battery usage user interface corresponding to the first time period, display the battery usage user interface that includes a representation of the battery usage attributed to the first application during the first time period and a representation of the battery usage attributed to the second application during the first time period;
    attribute a portion of battery usage of the first hardware subsystem during a second time period to the first application based on the battery usage of the first hardware subsystem that occurred during activity by the first application during the second time period;
    attribute a portion of the battery usage of the first hardware subsystem during the second time period to the second application based on the battery usage of the first hardware subsystem that occurred during activity by the second application during the second time period;
    receive a request to display the battery usage user interface corresponding to the second time period, the second time period at least partially overlapping with the first time period; and
    in response to the request to display the battery usage interface corresponding to the second time period, display the battery usage user interface including a representation of the battery usage attributed to the first application during the second time period and a representation of the battery usage attributed the second application during the second time period.

2. The non-transitory computer-readable storage medium of claim 1, wherein the battery usage user interface does not include a direct representation of the battery usage of the first hardware subsystem.

3. The non-transitory computer-readable storage medium of claim 1, wherein the battery usage user interface includes a representation of the battery usage of a second hardware subsystem that is not attributed to the first application or the second application.

4. The non-transitory computer-readable storage medium of claim 1, further comprising instructions to cause the device to:
attribute a portion of battery usage of a second hardware subsystem to the first application based on the battery usage of the second hardware subsystem that occurred during activity by the first application;
attribute a portion of the battery usage of the second hardware subsystem to the second application based on the battery usage of the second hardware subsystem that occurred during activity by the second application.

5. The non-transitory computer-readable storage medium of claim 1, further comprising instructions to cause the device to:
attribute a portion of battery usage of a first software subsystem to the first application based on the battery usage of the first software subsystem that occurred during activity by the first application;
attribute a portion of the battery usage of the first software subsystem to the second application based on the battery usage of the first software subsystem that occurred during activity by the second application.

6. The non-transitory computer-readable storage medium of claim 5, wherein the first software subsystem include a notification daemon.

7. The non-transitory computer-readable storage medium of claim 5, wherein the first software subsystem includes an operating system process.

8. The non-transitory computer-readable storage medium of claim 5, wherein a portion of the battery usage of a second software subsystem during activity by the first application is not attributed to the first application and a portion of the battery usage of the second software subsystem during activity by the second application is not attributed to the second application, and the battery usage user interface includes an item representing the second software subsystem including a representation of the battery usage attributed to the second software subsystem and not attributed to the first application or the second application.

9. The non-transitory computer-readable storage medium of claim 8, wherein the second software subsystem comprises a home screen or lock screen.

10. The non-transitory computer-readable storage medium of claim 8, wherein the second software subsystem comprises notifications.

11. The non-transitory computer-readable storage medium of claim 8, wherein the second software subsystem comprises a voice assistant.

12. The non-transitory computer-readable storage medium of claim 1, wherein the first hardware subsystem includes a central processing unit (CPU) or graphics processing unit (GPU).

13. The non-transitory computer-readable storage medium of claim 1, wherein the first hardware subsystem includes a wireless antenna.

14. The non-transitory computer-readable storage medium of claim 1, wherein the first hardware subsystem includes a display backlight.

15. The non-transitory computer-readable storage medium of claim 1, further comprising instructions to cause the device to:
attribute, to the first application, battery usage caused by a background activity benefiting the first application that occurred while the first application was not active.

16. The non-transitory computer-readable storage medium of claim 1, wherein the request to display the battery usage user interface corresponding to the first time period comprises activation of a portion of a segmented user interface element corresponding to the first time period.

17. The non-transitory computer-readable storage medium of claim 1, wherein the request to display the battery usage user interface corresponding to the second time period comprises activation of a portion of a segmented user interface element corresponding to the second time period.

18. The non-transitory computer-readable storage medium of claim 1, wherein the first time period is based on a period of operation of the device.

19. The non-transitory computer-readable storage medium claim 1, wherein the first time period corresponds to a tune period the device is powered.

20. The non-transitory computer-readable storage medium of claim 1, wherein the first time period corresponds to a calendar period.

21. The non-transitory computer-readable storage medium of claim 1, wherein the battery usage user interface includes representations of battery usage attributed to items having battery usage in excess of a threshold percentage of total battery usage, and the representations of battery usage attributed to the items represents substantially the total battery usage.

22. The non-transitory computer-readable storage medium of claim 1, wherein the battery usage user interface includes a representation of battery usage attributed to a second hardware subsystem.

23. The non-transitory computer-readable storage medium of claim 22, wherein a portion of the battery usage of the second hardware subsystem during activity by the first application is not attributed to the first application and a portion of the battery usage of the second hardware subsystem during activity by the second application is not attributed to the second application, and the battery usage user interface includes an item representing an operational state of the second hardware subsystem including a representation of the battery usage attributed to the second hardware subsystem and not attributed to the first application or the second application.

24. The non-transitory computer-readable storage medium of claim 23, wherein the operational state of the first hardware system comprises no cellular coverage.

25. The non-transitory computer-readable storage medium of claim 1, further comprising instructions to cause the device to:
receive a request to display a battery life histogram; and
in response to the request, display the battery life histogram including a representation of a change in a battery level of the device over a range of time.

26. The non-transitory computer-readable storage medium of claim 1, further comprising instructions to cause the device to:
while displaying the battery usage user interface including a representation of the battery usage attributed to the first application during the second time period and a representation of the battery usage attributed the second application during the second time period, receive a subsequent request to display the battery usage user interface corresponding to the first time period; and in response to the subsequent request to display a battery usage user interface corresponding to the first time period, display the battery usage user interface that includes the representation of the battery usage attributed to the first application during the first time period and the representation of the battery usage attributed to the second application during the first time period.

27. A method comprising:
at an electronic device with one or more processors and memory:
attributing a portion of battery usage of a first hardware subsystem during a first time period to a first application based on the battery usage of the first hardware subsystem that occurred during activity by the first application during the first time period;
attributing a portion of the battery usage of the first hardware subsystem during the first time period to a second application based on the battery usage of the first hardware subsystem that occurred during activity by the second application during the first time period;
receiving a request to display a battery usage user interface corresponding to the first time period;
in response to the request to display a battery usage user interface corresponding to the first time period, displaying the battery usage user interface that includes a representation of the battery usage attributed to the first application during the first time period and a representation of the battery usage attributed the second application during the first time period
attributing a portion of battery usage of the first hardware subsystem during a second time period to the first application based on the battery usage of the first hardware subsystem that occurred during activity by the first application during the second time period;
attributing a portion of the battery usage of the first hardware subsystem during the second time period to the second application based on the battery usage of the first hardware subsystem that occurred during activity by the second application during the second time period;
receiving a request to display the battery usage user interface corresponding to the second time period, the second time period at least partially overlapping with the first time period; and
in response to the request to display the battery usage interface corresponding to the second time period, displaying the battery usage user interface including a representation of the battery usage attributed to the first application during the second time period and a representation of the battery usage attributed the second application during the second time period.

28. The method of claim 27, wherein the battery usage user interface does not include a direct representation of the battery usage of the first hardware subsystem.

29. The method of claim 27, wherein the battery usage user interface includes a representation of the battery usage of a second hardware subsystem that is not attributed to the first application or the second application.

30. The method of claim 27, further comprising:
attributing a portion of battery usage of a first software subsystem to the first application based on the battery usage of the first software subsystem that occurred duting activity by the first application;
attributing a portion of the battery usage of the first software subsystem to the second application based on the battery usage of the first software subsystem that occurred during activity by the second application.

31. The method of claim 30, wherein a portion of the battery usage of a second software subsystem during activity by the first application is not attributed to the first application and a portion of the battery usage of the second software subsystem during activity by the second application is not attributed to the second application, and the battery usage user interface includes an item representing the second software subsystem including a representation of the battery usage attributed to the second software subsystem and not attributed to the first application or the second application.

32. The method of claim 27, further comprising:
attributing, to the first application, battery usage caused by a background activity benefiting the first application that occurred while the first application was not active.

33. The method of claim 27, wherein the request to display the battery usage user interface corresponding to the first time period comprises activation of a portion of a segmented user interface element corresponding to the first time period.

34. The method of claim 27, wherein the request to display the battery usage user interface corresponding to the second time period comprises activation of a portion of a segmented user interface element corresponding to the second time period.

35. The method of claim 27, wherein the battery usage user interface includes representations of battery usage attributed to items having battery usage in excess of a threshold percentage of total battery usage, and the representations of battery usage attributed to the items represents substantially the total battery usage.

36. The method of claim 35, wherein a portion of the battery usage of the second hardware subsystem during activity by the first application is not attributed to the first application and a portion of the battery usage of the second hardware subsystem during activity by the second application is not attributed to the second application, and the battery usage user interface includes an item representing an operational state of the second hardware subsystem including a representation of the battery usage attributed to the second hardware subsystem and not attributed to the first application or the second application.

37. The method of claim 27, further comprising:
while displaying the battery usage user interface including a representation of the battery usage attributed to the first application during the second time period and a representation of the battery usage attributed the second application during the second time period, receiving a subsequent request to display the battery usage user interface corresponding to the first time period; and
in response to the subsequent request to display a battery usage user interface corresponding to the first time period, displaying the battery usage user interface that includes the representation of the battery usage attributed to the first application during the first time period and the representation of the battery usage attributed to the second application during the first time period.

38. An electronic device, comprising:
a display;
a memory; and
a processor coupled to the display and the memory, the processor configured to:
attribute a portion of battery usage of a first hardware subsystem during a first time period to a first application based on the battery usage of the first hardware subsystem that occurred during activity by the first application during the first time period;

attribute a portion of the battery usage of the first hardware subsystem during the first time period to a second application based on the battery usage of the first hardware subsystem that occurred during activity by the second application during the first time period;

receive a request to display a battery usage user interface corresponding to the first time period;

in response to the request to display a battery usage user interface corresponding to the first time period, display the battery usage user interface that includes a representation of the battery usage attributed to the first application during the first time period and a representation of the battery usage attributed to the second application during the first time period;

attribute a portion of battery usage of the first hardware subsystem during a second time period to the first application based on the battery usage of the first hardware subsystem that occurred during activity by the first application during the second time period;

attribute a portion of the battery usage of the first hardware subsystem during the second time period to the second application based on the battery usage of the first hardware subsystem that occurred during activity by the second application during the second time period;

receive a request to display the battery usage user interface corresponding to the second time period, the second time period at least partially overlapping with the first time period; and in response to the request to display the battery usage interface corresponding to the second time period, display the battery usage user interface including a representation of the battery usage attributed to the first application during the second time period and a representation of the battery usage attributed the second application during the second time period.

39. The device of claim 38, wherein the battery usage user interface does not include a direct representation of the battery usage of the first hardware subsystem.

40. The device of claim 38, wherein the battery usage user interface includes a representation of the battery usage of a second hardware subsystem that is not attributed to the first application or the second application.

41. The device of claim 38, wherein the processor is further configured to:
attribute a portion of battery usage of a first software subsystem to the first application based on the battery usage of the first software subsystem that occurred during activity by the first application;
attribute a portion of the battery usage of the first software subsystem to the second application based on the battery usage of the first software subsystem that occurred during activity by the second application.

42. The device of claim 41, wherein a portion of the battery usage of a second software subsystem during activity by the first application is not attributed to the first application and a portion of the battery usage of the second software subsystem during activity by the second application is not attributed to the second application, and the battery usage user interface includes an item representing the second software subsystem including a representation of the battery usage attributed to the second software subsystem and not attributed to the first application or the second application.

43. The device of claim 38, wherein the processor is further configured to:
attribute, to the first application, battery usage caused by a background activity benefiting the first application that occurred while the first application was not active.

44. The device of claim 38, wherein the request to display the battery usage user interface corresponding to the first time period comprises activation of a portion of a segmented user interface element corresponding to the first time period.

45. The device of claim 38, wherein the request to display the battery usage user interface corresponding to the second time period comprises activation of a portion of a segmented user interface element corresponding to the second time period.

46. The device of claim 38, wherein the battery usage user interface includes representations of battery usage attributed to items having battery usage in excess of a threshold percentage of total battery usage, and the representations of battery usage attributed to the items represents substantially the total battery usage.

47. The device of claim 46, wherein a portion of the battery usage of the second hardware subsystem during activity by the first application is not attributed to the first application and a portion of the battery usage of the second hardware subsystem during activity by the second application is not attributed to the second application, and the battery usage user interface includes an item representing an operational state of the second hardware subsystem including a representation of the battery usage attributed to the second hardware subsystem and not attributed to the first application or the second application.

48. The device of claim 38, wherein the processor is further configured to:
while displaying the battery usage user interface including a representation of the battery usage attributed to the first application during the second time period and a representation of the battery usage attributed the second application during the second time period, receiving a subsequent request to display the battery usage user interface corresponding o the first time period; and
in response to the subsequent request to display a battery usage user interface corresponding to the first time period, display the battery usage user interface that includes the representation of the battery usage attributed to the first application during the first time period and the representation of the battery usage attributed to the second application during the first time period.

* * * * *

UNITED STATES PATENT AND TRADEMARK OFFICE
CERTIFICATE OF CORRECTION

PATENT NO. : 9,606,706 B2  
APPLICATION NO. : 14/503078  
DATED : March 28, 2017  
INVENTOR(S) : Amit K. Vyas et al.

Page 1 of 1

It is certified that error appears in the above-identified patent and that said Letters Patent is hereby corrected as shown below:

In the Claims

At Column 38, Claim number 19, Line number 20, after "medium" insert -- of --

At Column 38, Claim number 19, Line number 21, delete "tune" and insert -- time --

At Column 39, Claim number 30, Line number 65, delete "duting" and insert -- during --

At Column 42, Claim number 48, Line number 50, delete "o" and insert -- to --

Signed and Sealed this  
Thirtieth Day of May, 2017

Michelle K. Lee  
*Director of the United States Patent and Trademark Office*